United States Patent
Akram et al.

(10) Patent No.: US 8,637,962 B2
(45) Date of Patent: Jan. 28, 2014

(54) SEMICONDUCTOR DICE INCLUDING AT LEAST ONE BLIND HOLE, WAFERS INCLUDING SUCH SEMICONDUCTOR DICE, AND INTERMEDIATE PRODUCTS MADE WHILE FORMING AT LEAST ONE BLIND HOLE IN A SUBSTRATE

(75) Inventors: Salman Akram, Boise, ID (US); Sidney B. Rigg, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/620,065

(22) Filed: Sep. 14, 2012

(65) Prior Publication Data

US 2013/0043588 A1 Feb. 21, 2013

Related U.S. Application Data

(63) Continuation of application No. 13/187,133, filed on Jul. 20, 2011, now Pat. No. 8,324,101, which is a continuation of application No. 11/776,137, filed on Jul. 11, 2007, now Pat. No. 7,989,345, which is a continuation of application No. 11/219,315, filed on Sep. 1, 2005, now Pat. No. 7,772,116.

(51) Int. Cl.
*H01L 21/4763* (2006.01)

(52) U.S. Cl.
USPC ............. 257/621; 257/E21.585; 438/639; 438/667; 438/675

(58) Field of Classification Search
None
See application file for complete search history.

(56) References Cited

U.S. PATENT DOCUMENTS

| | | | |
|---|---|---|---|
| 5,275,330 A | 1/1994 | Isaacs et al. | |
| 6,076,726 A | 6/2000 | Hoffmeyer et al. | |
| 6,716,737 B2 | 4/2004 | Plas et al. | |
| 6,864,172 B2 * | 3/2005 | Noma et al. | 438/674 |
| 7,300,857 B2 | 11/2007 | Akram et al. | |
| 7,646,100 B2 | 1/2010 | Kameyama et al. | |
| 7,772,116 B2 | 8/2010 | Akram et al. | |
| 7,989,345 B2 | 8/2011 | Akram et al. | |
| 2006/0043154 A1 | 3/2006 | Kirby et al. | |
| 2006/0205211 A1 | 9/2006 | Kirby | |
| 2007/0164419 A1 | 7/2007 | Sherrer et al. | |

* cited by examiner

*Primary Examiner* — Zandra Smith
*Assistant Examiner* — Pamela E Perkins
(74) *Attorney, Agent, or Firm* — TraskBritt

(57) ABSTRACT

Semiconductor dice comprise at least one bond pad on an active surface of the semiconductor die. At least one blind hole extends from a back surface of the semiconductor die opposing the active surface, through a thickness of the semiconductor die, to an underside of the at least one bond pad. At least one quantity of passivation material covers at least a sidewall surface of the at least one blind hole. At least one conductive material is disposed in the at least one blind hole adjacent and in electrical communication with the at least one bond pad and adjacent the at least one quantity of passivation material.

16 Claims, 14 Drawing Sheets

SEMICONDUCTOR DICE INCLUDING AT LEAST ONE BLIND HOLE, WAFERS INCLUDING SUCH SEMICONDUCTOR DICE, AND INTERMEDIATE PRODUCTS MADE WHILE FORMING AT LEAST ONE BLIND HOLE IN A SUBSTRATE

CROSS-REFERENCE TO RELATED APPLICATIONS

This application is a continuation of U.S. patent application Ser. No. 13/187,133, filed Jul. 20, 2011, now U.S. Pat. No. 8,324,101, issued Dec. 4, 2012, which is a continuation of U.S. patent application Ser. No. 11/776,137, filed Jul. 11, 2007, now U.S. Pat. No. 7,989,345, issued Aug. 2, 2011, which is a continuation of U.S. patent application Ser. No. 11/219,315, filed Sep. 1, 2005, now U.S. Pat. No. 7,772,116, issued Aug. 10, 2010, the disclosure of each of which is hereby incorporated herein by this reference in its entirety.

BACKGROUND OF THE INVENTION

1. Field of the Invention

The present invention relates to semiconductor devices and fabrication methods therefor. More particularly, the invention pertains to methods for forming conductive blind vias (blind wafer interconnects) in a substrate such as a semiconductor wafer or other substrate, and related structures and assemblies.

2. Background of Related Art

Semiconductor devices that have integrated circuits are produced by fabricating a large plurality of identical circuit patterns on a semiconductor wafer or other bulk semiconductor substrate. Each circuit pattern defines the location of a semiconductor die, there being circuit-devoid areas, commonly termed "streets" between each semiconductor die location. A plethora of processes is typically used, including, for example, deposition, plating, doping, photolithography, etching, laser ablation, oxidation, nitridation, mechanical and chemical-mechanical planarization, wafer thinning, die separation (singulation), testing and packaging. Inasmuch as major goals of semiconductor manufacturers are increased performance and lower cost, considerations such as device density (with concomitant circuit speed and reduced power requirements) and enhanced reliability have taken a high priority. The proliferation of hand-held apparatus such as cellular phones, GPS units, entertainment devices, PDAs, and the like, has incentivized development of electronic circuitry of greatly reduced size and enhanced capabilities in terms of function and speed. In addition, a significant manufacturing goal to enhance throughput, reduce cost and minimize handling of semiconductor dice after singulation is to perform as many of the fabrication, test and packaging processes on an entire wafer prior to die separation (singulation).

One of the critical limitations in the production of miniature semiconductor devices relates to electrical conductors for connection of their integrated circuit(s) to an apparatus such as a circuit board or another die. Conventionally, a semiconductor device has an array of conductive bond pads electrically connected to the integrated circuit (IC) by active surface metallization. Connection of these bond pads to another device or circuit board may conventionally utilize fine wires, commonly termed wire bonds, which are subject to displacement (leading to short-circuits with other conductors) and breakage (leading to open circuits). Despite having a relatively long history of widespread use in the industry, wire-bonding remains a time-consuming and expensive process. The propensity to wire damage is increased as the devices become more miniaturized and dense. Where a plurality of individual dice are joined to form a multi-chip module (MCM), wiring costs and high rates of wire damage represent particularly substantial problems. Further, wire bonds exhibit undesirably high inductance, 5 nH being typical.

One way to increase the density of semiconductor devices in a semiconductor assembly is to stack semiconductor dice one upon another. The semiconductor dice may be interconnected by forming conductive vias passing through the semiconductor substrate material, perpendicular to the active surface. The vias are filled with an electrically conductive material and the vias are connected, either directly or through metallization, to integrated circuitry fabricated on active surfaces of a semiconductor wafer. Thus, the vias provide a conductive pathway from the active surface of a semiconductor die to its back surface, enabling interconnection of via ends on the back surface of the semiconductor die to external electrical contacts of another semiconductor die or a carrier substrate, such as a circuit board, interposer or other higher level packaging. Via holes may be conventionally formed by mechanical drilling, etching, laser ablation, or a combination thereof. In an etching method, photolithographic processing of a photoresist may be used to define a pattern and size for the via holes, followed by wet (chemical) or dry (reactive ion) etching of unmasked areas of the substrate. Laser ablation has been used to form vias by ablating semiconductor material from a semiconductor substrate to form holes extending through a partial thickness or the entire thickness of the substrate. Substrate material damaged by the heat of the laser is then often removed by a subsequent wet etch process.

Various conductive structures on a semiconductor die or wafer may be interconnected or connected to other components by a via, including bond pads, component leads, metal wires, metal layers and annular rings. Bond pads on semiconductor dice are typically formed from tungsten, aluminum, copper, or aluminum-copper alloys having less than about 0.5% copper, although other materials may be used.

A conductive via passing between a wafer back side and the underside of a conductive structure on or in the active surface of the wafer may be defined herein as a blind wafer interconnect (BWI). Such a via has theoretical advantages including the following: (a) conductor lengths are shortened, enhancing circuit speed; (b) the die footprint is not increased by die interposers, bond wires, TAB connectors, etc.; and (c) a die may be electrically connected to carrier substrates, semiconductor dice and other components from both its active surface and its back side.

In a conventional method, BWIs are formed by the acts of etching or laser-ablating holes, or both, through a semiconductor substrate (e.g., wafer or die) from the back side, blanket-depositing or forming a layer of passivating material on the back side of the semiconductor substrate and on the walls of the holes, lining or filling the holes with a conductive material such as solder and thinning the substrate back side by an abrasive technique such as chemical-mechanical planarization (CMP) to a desired substrate thickness. The CMP results in a bare semiconductor (e.g., silicon) surface which closely abuts the conductive via, leading to potential short-circuiting to the substrate material when a solder ball or other conductor is joined to the conductive via end.

In order to prevent short-circuiting, the bare semiconductor substrate back side (excluding via ends) may be selectively etched back so that the via end with surrounding passivating layer may protrude from the etched back, substrate back side. Then, a further layer of passivating material may be blanket-deposited over the substrate back side to ensure complete dielectric coverage about the via end. However, the face of the protruding via end will also become covered with passivating material, which must be removed before the via end can be conductively joined to a solder ball, solder column or other external connector. Such passivating material removal may be accomplished by a mask-and-etch technique requiring additional process acts. Overall, this method requires numerous acts, is costly, and may not achieve the desired reliability.

A method for improving the connection of hollow through hole vias in a printed circuit board (PCB) to an electronic module is described in U.S. Pat. No. 5,275,330 to Isaacs et al. As shown in this reference, each via is filled step-wise until completely filled, prior to placement and attachment of solder balls of a module. Multiple pass solder plugging steps are required and assembly yield is lower than desirable. This method may sometimes result in other problems, including molten/softened solder drainage from the via due to gravity and replacement by solder from the adjacent solder ball.

As shown in U.S. Pat. No. 6,076,726 to Hoffmeyer et al., it is proposed to plate cylindrical via walls with a metal, such as nickel, which is not wetted sufficiently by the reflowing of a lead-tin eutectic solder using fluxes which allow good wetting to copper. A capture pad of the via is copper plated to effect good wetting to a solder ball. The goal of the reference is to form a hollow (cylindrical) via which is not wettable for solder adhesion, while the capture pad is wetted.

There are substantial differences in forming vias in a circuit board and forming vias in a semiconductor wafer bearing many discrete microchip circuits. While a circuit board is typically manufactured at a desired final thickness, semiconductive materials such as silicon, and the like, are fragile materials, subject to easy fracture. Fabrication of electronic devices on an entire semiconductor wafer is typically conducted before the wafer is thinned by a back grinding process such as CMP to a desired final thickness. Thus, for example, in conventional practice, multiple circuits may be formed on a wafer having an initial thickness of about 725 µm to 750 µm, and the wafer is then back-ground to a desired thickness of between about 150 µm and 250 µm. Any further processing in wafer form is then followed by semiconductor die singulation and packaging.

Efforts to overcome the disadvantages of the prior art with respect to the use of vias in a semiconductor substrate have led the inventors herein to the methods of the present invention.

BRIEF SUMMARY OF THE INVENTION

The present invention, in a number of embodiments, comprises methods for making small-diameter blind-wafer interconnects (BWIs) in substrates such as semiconductor wafers. More specifically, the methods pertain to the formation of a blind hole, and formation of a passivating layer on the back surface of a substrate and interior hole surfaces prior to filling the blind hole with solder or other conductive material. The blind hole may be formed by etching, laser ablation, mechanical drilling, or a combination of such techniques. In one embodiment, CMP may be utilized to remove excess photoresist and metal seed material from the substrate back side, without entrapping particles in the blind hole. The blind wafer interconnects (BWIs) formed by methods of the invention may be used to electrically connect conductors on the back side of a substrate to conductors, e.g., bond pads, on the front side (i.e., active surface) thereof. The entire BWI-forming process may be completed at the wafer level, to reduce both processing time and expense. The invention alleviates the afore-stated problems in forming blind wafer interconnects by conventional methods.

Details of several embodiments of the invention include formation of a conductive blind via (e.g., BWI) with a back side pad having a controllable size. The pad size may be varied to provide a convenient base for the attachment of discrete conductive elements in the form of balls, columns, studs, pillars and the like formed of metals, alloys (including solders), conductive epoxies, and conductor-filled epoxies. Alternatively, a projecting slug end may be formed on the BWI to act as a temporary (e.g., for testing) or permanent connector without the need for application of a discrete conductive element thereto. Thus, the invention may be useful for enabling column grid array (CGA), ball grid array (BGA), slug grid array (SGA) and other types of interconnection between stacked dice in a multi-chip module (MCM).

The methods of the present invention may be generally described, infra, in the context of forming a blind wafer interconnect (BWI) in a substrate such as a semiconductor wafer in an intermediate stage of manufacture, i.e., following circuit fabrication but before die singulation and packaging. Thus, BWIs may be formed following the creation of multiple identical integrated circuits (ICs), including bond pads or other conductive terminals on the first or active surface of a semiconductor wafer. The methods of the present invention are particularly suited to forming BWIs in a wafer, which has already been thinned to a final thickness. More particularly, these methods may be particularly useful for connecting an existing bond pad or other conductor on a first (active) surface with conductors to be formed on a second (back side) surface of the substrate or to another substrate closely spaced from the back side surface. The method obviates the use of wire bonds and enables the formation of high density devices. The present invention also includes electronic apparatus, optoelectronic devices and the like incorporating blind wafer interconnects formed by methods of the invention.

In accordance with one embodiment of the invention, at least one blind via or blind wafer interconnect (BWI) is formed in a substrate such as, e.g., a semiconductor wafer by determining the location of the at least one blind wafer interconnect to be formed in the substrate structure from the back side (second surface) thereof, depositing or forming a first oxide layer or other passivation layer over the back side if one does not already exist, forming a blind hole at each desired location from the back side of the substrate structure to a desired distance or depth to meet the underside of a conductor (e.g., bond pad) on the active or first surface of the substrate, blanket-depositing a second passivating layer such as oxide to cover the second surface as well as the sidewalls and blind end of each blind hole, spacer-etching the second passivating layer to remove it from the blind end of each blind hole and at least partially from the surface of the back side (second surface), applying a seed layer or layers of metal(s) or metal alloy(s) over the remaining portions of the first and second passivating layers and the exposed underside of the conductor on the first surface, to enhance bonding of solder or other metal(s) thereto, optionally depositing a barrier layer in addition to one or more seed layers, blanket-depositing a photoresist material to completely fill the blind hole and form a photoresist layer over the seed (and, if present, barrier) layer(s) on the second surface, removing the photoresist material and seed (and, if present, barrier) layer(s) from the second surface by chemical-mechanical planarization (CMP), leaving a sufficient depth of passivating material to insulate the second surface, stripping the photoresist material from the blind hole and cleaning the hole, and applying a solder or other conductive material or materials within the blind hole to adhere to the wettable seed layer(s) to fill the blind hole. For example, the blind hole may be filled with copper or nickel by electroless plating or electroplating to form a solder ball pad. Alternatively, the BWI may be formed to have a slug end which extends outwardly to act as a ball-less connector, a structure which may, without limitation, be especially useful for circuit testing. Where a connection pad is formed, the pad dimensions may be varied by controlling the pattern of photoresist cure and subsequent removal by etching.

In a variation of the above-described embodiment of the invention, after spacer-etching the second passivating layer to remove it from the blind end of each blind hole and at least partially from the surface of the back side (second surface), a metal layer in the form of an annulus or ring is blanket deposited on the sidewalls and blind end of each blind hole, the metal layer extending over the back side (second surface) of the semiconductor wafer. A photoresist material is then blanket-deposited to completely fill the blind hole and form a photoresist layer over the metal layer on the second surface, the photoresist material and metal layer and seed (and, if present, barrier) layer(s) then being removed from the second surface by chemical-mechanical planarization (CMP), exposing an annular end of the metal layer within the blind hole and leaving a sufficient depth of passivating material to insulate the second surface, the photoresist material being stripped from each blind hole and each blind hole filled with a dielectric material. The blind hole may be filled with, for example, a spin-on dielectric material such as a polyimide. Subsequently, a conductive bump, such as a solder bump, another metal or alloy bump, or a conductive or conductor-filled polymer, may be placed on and bonded to the exposed annular end of the metal layer, or a ring of solder placed, reflowed and bonded to the exposed annular end of the metal layer. Alternatively, the BWI may be formed to have a slug end which extends outwardly to act as a ball-less connector, a structure which may, without limitation, be especially useful for circuit testing. Where a connection pad is formed, the pad dimensions may be varied by controlling the pattern of photoresist cure and subsequent removal by etching.

In accordance with the invention, the above method may be varied to accommodate particular situations, such variations falling within the purview of the invention.

The methods of the invention are particularly advantageous in the production of die-stacked devices, such as stacked DRAMs, SRAMs, PCRAMs, MRAMs, CAMs, Flash memory devices, and combinations thereof, as well as optoelectronic devices including CMOS imagers, and other devices desirably electrically connected to higher level packaging by their back sides. The method is also useful for simply connecting a conductor on one surface of a thinned or thinnable semiconductor substrate to the other.

The methods of the invention offer substantial advantages over the prior art. Each of the acts in the method of the present invention uses known and well-developed technology. The method enables the production of high density BWI arrays without the aforementioned problems known in the prior art. Furthermore, BWI formation according to the present invention may be conducted at the wafer stage, whereby each act of the method may be simultaneously applied to all of the individual semiconductor devices on the wafer.

The present invention also encompasses semiconductor dice including BWIs of the present invention and multi-chip modules comprising a stack of two or more dice including BWIs of the present invention.

In some embodiments, semiconductor dice comprise at least one bond pad on an active surface of the semiconductor die. At least one blind hole extends from a back surface of the semiconductor die opposing the active surface, through a thickness of the semiconductor die, to an underside of the at least one bond pad. At least one quantity of passivation material covers at least a sidewall surface of the at least one blind hole. At least one conductive material is disposed in the at least one blind hole adjacent and in electrical communication with the at least one bond pad and adjacent the at least one quantity of passivation material.

In other embodiments, semiconductor wafers comprise a plurality of unsingulated semiconductor dice. At least one unsingulated semiconductor die of the plurality of unsingulated semiconductor dice comprises at least one bond pad on an active surface of the at least one unsingulated semiconductor die. At least one blind hole extends from a back surface of the at least one unsingulated semiconductor die opposing the active surface, through a thickness of the at least one unsingulated semiconductor die, to an underside of the at least one bond pad. At least one quantity of passivation material covers at least a sidewall surface of the at least one blind hole. At least one conductive material is disposed in the at least one blind hole adjacent and in electrical communication with the at least one bond pad and adjacent the at least one quantity of passivation material.

In yet other embodiments, intermediate products made while forming a blind hole in a substrate comprise at least one bond pad on an active surface of the substrate. At least one blind hole extends from a back surface of the semiconductor die opposing the active surface, through a thickness of the semiconductor die, to an underside of the at least one bond pad. At least one quantity of passivation material covers at least a sidewall surface of the at least one blind hole. A sacrificial material configured for removal from the at least one blind hole is disposed in the at least one blind hole adjacent the at least one bond pad and adjacent the at least one quantity of passivation material.

Other features and advantages of the present invention will become apparent to those of skill in the art through consideration of the ensuing detailed description, the accompanying drawings, and the appended claims. The drawings are idealized representations for better illustration of the methods of the invention, and various elements are not necessarily shown to scale.

BRIEF DESCRIPTION OF THE SEVERAL VIEWS OF THE DRAWINGS

In the drawings, which depict embodiments of various features of the present invention, by way of example only.

DETAILED DESCRIPTION OF THE INVENTION

Figure 1:
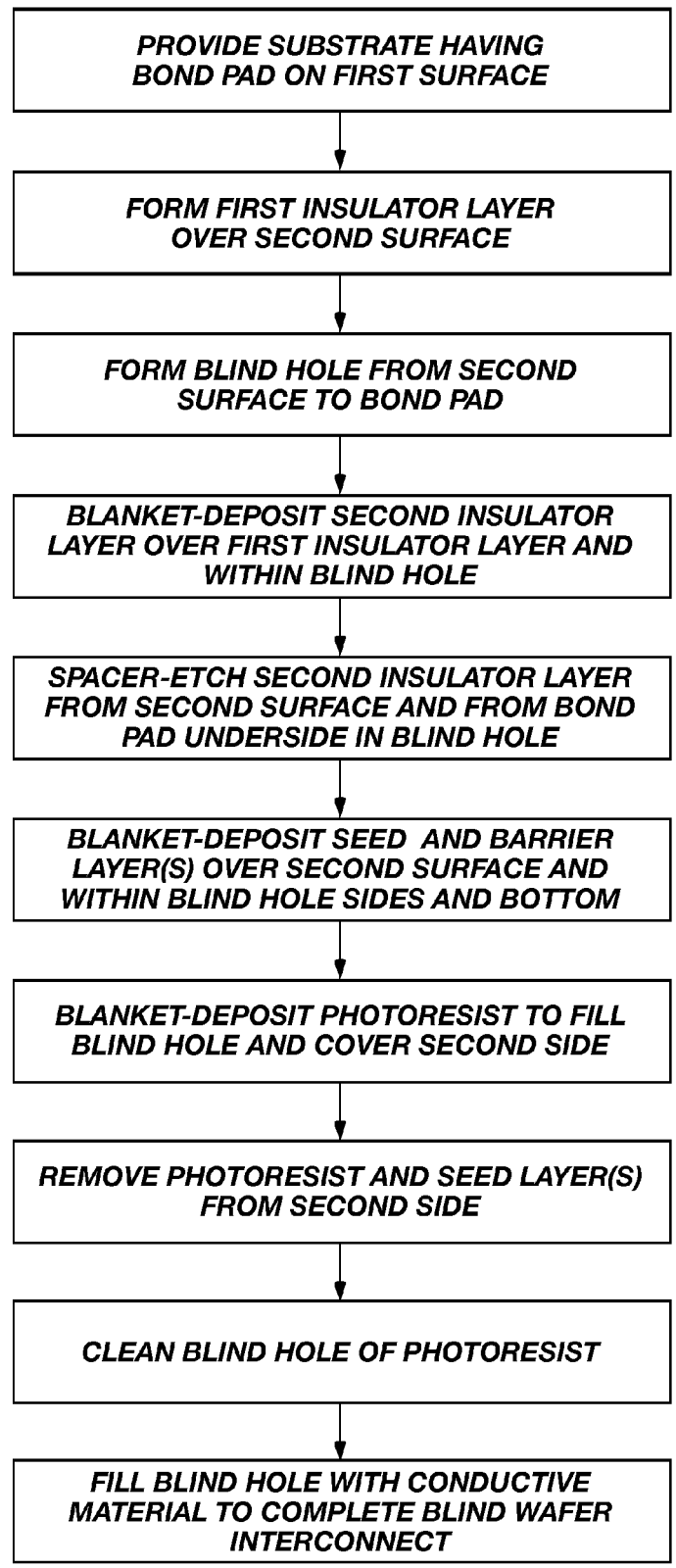
FIG. 1 is a flowchart indicating acts in forming a blind wafer interconnect in a substrate structure in accordance with a method of the present invention.

The invention comprises methods for forming blind vias ("BVs") also known as blind wafer interconnects ("BWIs"), which penetrate into a second surface of a semiconductor substrate structure, typically to contact bond pads or other conductors on the first surface. Referring to FIG. 1A, the first surface may be an active surface 12 of a wafer 10 or other bulk semiconductor substrate and the second surface is a wafer back side surface 14. The term "via" is a general term denoting a conductor passing into or through a semiconductor substrate structure substantially transverse to a major plane of the substrate. The term "blind wafer interconnect" is often used more specifically where the substrate structure is a wafer (see FIG. 1A) or other bulk substrate of semiconductor material. In this application, the terms will be used interchangeably as applying to any substrate material comprising a layer of semiconductor material and which may be subjected to a thinning process for reducing an initial thickness 44 (see FIG. 2) thereof. Thus, the methods of the invention are applicable to semiconductor devices whether in the wafer or bulk substrate form, partial wafer faun or individualized die form, as well as to non-semiconductor materials bearing semiconductor layers thereon and which are thinned to a final thickness. The methods of the present invention are most efficient when applied to a multi-chip wafer or other bulk substrate. The term "substrate structure" refers not only to silicon wafers (e.g., monocrystalline silicon or polycrystalline silicon) but also to silicon-on-insulator ("SOI") substrates, silicon-on-sapphire ("SOS") substrates, silicon-on-glass ("SOG") substrates, germanium-on-silicon ("GOS") substrates, epitaxial layers of silicon on a base semiconductor foundation, and other semiconductor materials, such as gallium arsenide, diamond, germanium, ruby, quartz, sapphire, silicon carbide and indium phosphide, for example. The methods of the invention are applicable to any semiconductor substrate structure in which blind wafer interconnects are to be formed. Thus, for example, the semiconductor substrate structure may comprise one or more dynamic random access memory (DRAM) devices, stacked DRAM devices (multi-chip modules), static random access memory (SRAM) devices, PCRAM devices, MRAM devices, CAM devices, Flash memory devices, imagers and the like, as well as processors and logic devices. The foregoing lists are not intended to be exhaustive or limiting in nature, but to exemplify the wide range of substrate materials and applicable uses of the invention. In this description, the invention will be exemplified in the formation of wafers of imager devices and DRAM devices, without limitation thereto. Again referring to FIG. 2 of the drawings, the invention may be applied to substrate structures in the form of wafers 10 in which the substrate material 8 has been thinned from its back side surface 14 from an initial thickness of, for example, about 725 μm to 750 μM to a desired final thickness 44 of between about 150 μm and 250 μm. If a layer 24 (see FIG. 3) of sufficient strength and rigidity has been applied over first surface of wafer 10 prior to thinning, as by back grinding, it is contemplated that the final thickness 44 may be even less than about 150 μm and approach about 50 μm, providing the capability of fabricating an extremely low profile MCM from stacked dice.

In this discussion, it will be understood that conventional methods for wafer fabrication which may precede any methods of testing and packaging which may follow the formation of BWIs 50 (see FIGS. 12 through 14B and 19 through 23) are generally known to those of ordinary skill in the art, and thus are not described in detail or apart from the context of the invention. The drawings generally show a single BWI 50 but it is understood that the invention is inclusive of the formation and existence of any number of BWIs in a semiconductor substrate structure. Thus, for example, hundreds or even thousands of BWIs 50 may be formed in groups or arrays in a plurality of semiconductor dice 16 fabricated on a single substrate structure such as a semiconductor wafer 10.

Figure 1A:
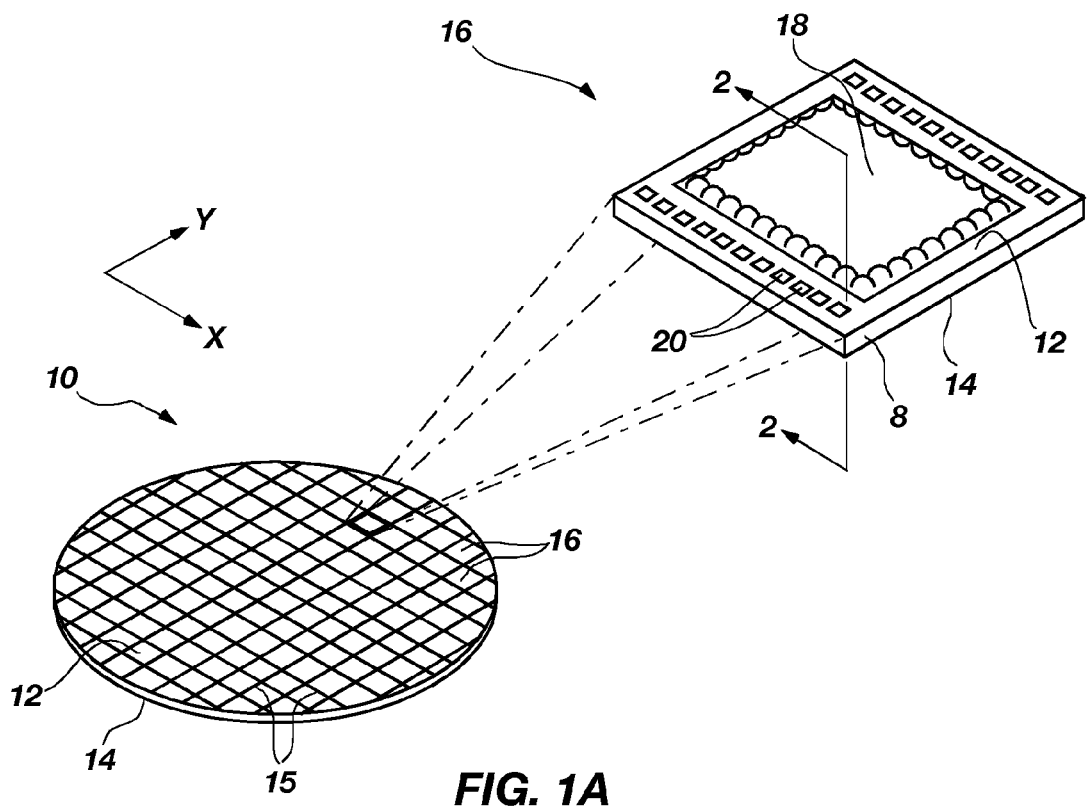
FIG. 1A is an isometric view of a substrate structure comprising a wafer and an enlarged view of an exemplary individual imager device of the wafer to which the methods of the present invention for forming a blind wafer interconnect are applicable.

Major acts in an exemplary embodiment of a method of the invention are generally outlined in FIG. 1 and illustrated in FIGS. 1A through 14B relating to a particular embodiment, in which the substrate structure is shown as an exemplary multi-die semiconductor wafer 10 of imager device (such as CMOS imagers) dice 16, although the methods of the present invention are not limited to any particular die configuration or function. The process outlined in FIG. 1 is not exhaustive of the method. For example, various cleaning acts are not shown, but are well-known to those of ordinary skill in the art. The substrate structure (wafer) 10 has a plurality of bond pads 20 which are to be electrically joined by BWIs 50 (see, for example, FIG. 12) to the wafer back side surface 14. As indicated in FIG. 2, the substrate structure (wafer) 10 has been previously thinned to a final thickness 44 by techniques well known in the art.

The particular processes and/or materials used in each act may vary, resulting in many embodiments. A discussion of specific exemplary embodiments follows, including references to variations and additions, which may be applied to the methods of the invention.

As depicted in FIG. 1A, an exemplary semiconductor substrate structure may be a wafer 10 comprised of a plurality of unseparated dice 16, each of which is shown as an imager device with microlenses 18 and conductive structures in the form of bond pads 20 disposed on the first, or active, surface 12. As known in the art, the bond pads 20 comprise electrical terminals connected to a circuit associated with microlenses 18 as well as to other electrical components which may be formed on or in the first surface 12. Typically, while the first surface 12 is known as an "active surface," the wafer has an opposing second surface 14 which comprises the "back side" thereof. The opposing surfaces 12, 14 of each die 16 are defined by streets 15 in the X- and Y-axes along which the dice will be later singulated conventionally by cutting, as by a wafer saw.

Figure 2:
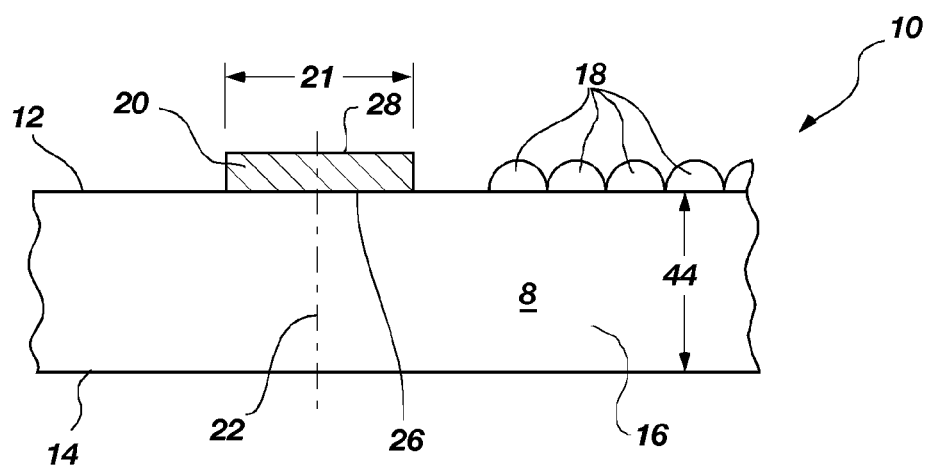
FIG. 2 is an enlarged cross-sectional side view of a portion of an example substrate structure taken along section line 2-2 of FIG. 1A, wherein a blind wafer interconnect (BWI) is to be formed in accordance with the present invention.

Referring now to FIG. 2, there is shown a cross-section of a portion of an exemplary semiconductor component identified herein as an imager die 16 formed as part of semiconductor wafer 10. As used herein, the term "semiconductor component" is not limited to bare semiconductor dice 16 having active circuitry thereon, but encompasses other substrate structures and features employed in packaging, mounting and testing of assemblies incorporating semiconductor dice 16. The substrate material 8 of the exemplary embodiment may comprise a material such as monocrystalline silicon, silicon-on-glass, silicon-on-sapphire, gallium arsenide, indium phosphide, germanium, or germanium-on-silicon. As used herein, the term "substrate" refers to any generally planar supporting structure including, but not limited to, semiconductor wafers, bulk semiconductor substrates, single dice, or other semiconductor components. For the sake of ease and clarity of description, the methods of the present invention will be described herein with reference to a monocrystalline semiconductor substrate structure in the Ruin of a wafer 10 of CMOS imager dice 16 in an intermediate stage of manufacture.

FIG. 2 shows only a small cross-sectional portion of a single die 16 within substrate structure 10. A blind wafer interconnect 50 (FIG. 12) is to be formed to extend from the second surface 14 to the underside 26 of bond pad 20, so that the integrated circuit (not identified) of each die 16 may be connected by its second surface 14 to a circuit board, to another die, to a test apparatus or to another substrate, not shown in this drawing. The first surface 12 is conventionally covered with a passivating layer, except for surfaces bearing optoelectronic devices. This passivating layer is not identified or shown in the drawings inasmuch as for BWI formation in accordance with this invention and may be, for example, an oxide or nitride of silicon, a silicon glass such as borophosphosilicate glass (BPSG), or a polyimide.

Figure 3:
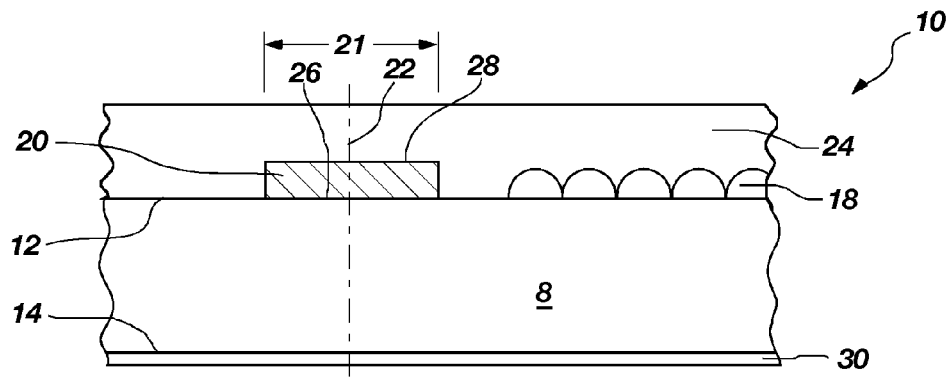
FIG. 3 is a cross-sectional side view of a portion of an example substrate structure of FIG. 2 following application of a first back side dielectric layer and an upper support layer in accordance with an embodiment of the present invention.

Likewise, the second surface 14 of a substrate structure 10 may be already covered with a first, electrically insulating oxide layer 30. If the wafer 10 is not supplied with such a first oxide layer 30, such as following second-surface thinning to final thickness 44, a first oxide layer 30 is applied to or formed on the second surface 14. In this example, as depicted in FIG. 3, a first oxide layer 30 is applied to (or grown on) the second surface 14 prior to formation of blind hole 40 along axis 22 (see FIG. 4). The first oxide layer 30 may be a silicon "oxide"

layer, such as a layer of silicon dioxide (SiO$_2$); however, the term "oxide" in this context may include a passivating layer of silicon nitride, silicon oxynitride, phosphosilicate glass ("PSG"), borosilicate glass ("BSG"), borophosphosilicate glass ("BPSG"), or it may be a spin-on dielectric ("SOD") material such as polyimide, benzocyclobutene (BCB) or other dielectric materials or combinations thereof. Thus, the first oxide layer 30 may broadly encompass a layer of material, which has the desired electrical insulating properties and working properties of an oxide. The first oxide layer 30 may, optionally, comprise a sandwich structure of more than one material, such as a sandwich structure of silicon dioxide and silicon nitride. The first oxide layer 30 may have, by way of example only, a thickness of between about 0.5 µm and about 10 µm.

As shown in FIG. 3, structure such as microlenses 18, bond pads 20, etc., formed on the first surface 12 may, optionally, be covered by a layer 24 of polyimide or other material for one or more purposes. Layer 24 may act as a carrier and structural support to strengthen the wafer during and after thinning and protect it from damage during subsequent handling and processing. Alternatively, layer 24 may simply comprise a passivating or packaging layer. In this example, layer 24 is shown as a carrier support covering the upper surface 28 of bond pad 20 as well as the array of microlenses 18, and is intended to be removed from wafer 10 prior to singulation.

Figure 4:
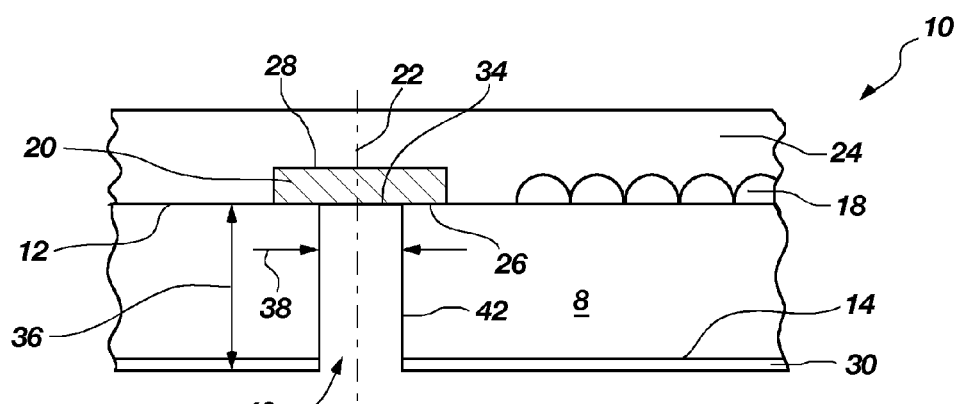
FIG. 4 is a cross-sectional side view of a portion of the example substrate structure of FIG. 3 following formation of a back side blind hole through the first dielectric layer and substrate structure to a bond pad underside, in accordance with an exemplary embodiment of the present invention.

The desired location of each blind hole 40 to be formed is determined such that the hole will intersect the center (or optionally another desired location) of an underside 26 of bond pad 20 or other desired conductor. Each location is preferably pre-programmed into process control software for automated formation of blind holes 40 in the back side of the substrate structure 10. As seen in FIG. 4, by specifying a blind hole diameter 38 smaller than the foot print dimensions 21 of bond pad 20, a margin of error is provided in placement of the hole entirely within the footprint. Preferably, the blind hole diameter 38 may be about one-half or less of the smallest foot print lateral dimension 21 of bond pad 20.

As shown in FIG. 4, a blind hole 40 is formed to pass through the first oxide layer 30 and through the substrate material 8 from the second (back side) surface 14. The exemplary blind hole 40 is formed with a terminus (blind end) 34 at the underside 26 of bond pad 20, exposing the conductive surface thereof.

Blind hole 40 may be formed by any method which effectively forms a hole of a desired shape, depth 36, diameter or lateral dimension 38 and configuration of terminus 34 along axis 22 in the particular substrate material 8 and overlying first oxide layer 30. Thus, a blind hole 40 may be formed by laser drilling or ablation, conventional dry etch chemistries such as a reactive ion etch, conventional wet etch chemistries, mechanical drilling, or other processes for forming a small diameter opening in a substrate structure 10. Each of these hole forming processes is well known to those of ordinary skill in the art. A combination of treatments may be utilized to form the blind hole 40. In the illustrated example of FIG. 4, blind hole 40 is formed through the first oxide layer 30 and the bulk substrate material 8 by an anisotropic lithographic etching process. For example, blind hole 40 may be formed as hereinafter described.

A photoresist layer is applied to cover the first oxide layer 30, masked, exposed and developed to pattern and define a blind hole location and size, as known in the art. A blind hole 40 is then established by etching, for example, using an HF-based etch, through an aperture defined by the pattern in the photoresist layer and first oxide layer 30. An additional anisotropic etch through the bulk substrate material 8 with a conventional etchant such as Bosch type (SF$_6$C$_2$F$_4$) or other type will extend the blind hole 40 to the underside 26 of bond pad 20. Optionally, the blind hole 40 may be deepened by either use of another type of etchant or by laser ablation to the desired endpoint. Optionally, blind hole 40 may be formed by use of a single etchant.

Laser drilling may be effected using equipment, such as a Model 5000-series laser, offered by ElectroScientific Industries of Portland, Oreg. One specific suitable laser apparatus is a 355 nm wavelength UV YAG laser, Model 2700. Another suitable laser system is the Xise 200, offered by Xsil Ltd., of Dublin, Ireland, which company also has a U.S. office in Loveland, Colo. The Xsil product may be used to form vias or blind holes 40 as small as about 10 µm to about 15 µm in diameter, and larger. Areas of substrate material 8 continuously irradiated by a laser may reach a temperature of about 1400° C., at which point severe damage to the substrate material 8 is likely to occur. Thus, a plurality of short bursts maintains the substrate material 8 at a temperature below which damage, such as dopant redistribution, occurs to the substrate material 8. Damage is believed to occur at temperatures above about 600° C. A 355 nm wavelength laser, as previously referenced, may be operated at a power of about 4 watts to 9 watts, for example, 5 watts, and from about a 20 kHz to a 60 kHz cycle or repetition rate to form the blind hole 40. If laser drilling is used to form the blind hole 40, a wet etchant, such as an HF-based etch, may be used to remove the native oxide, i.e., first oxide layer 30 present at the blind hole locations before laser drilling is commenced. The laser drilling may be followed by a 6% tetramethyl ammonium hydroxide (TMAH) in propylene glycol solution wet process to smooth the silicon and remove any debris resulting from the laser drilling process.

Although a blind hole 40 of up to approximately 50 µm or greater diameter 38 may be readily formed by the foregoing methods of this invention, hole diameters as small or smaller than about 10 µm to 25 µm may also be achieved. The blind hole 40 may have any cross-sectional shape or configuration as known in the art, including circular, oval, trapezoidal, or combinations thereof.

As noted above, after formation of a blind hole 40, the inner surfaces, i.e., sidewalls 42 and terminus 34 may require cleaning. When formed by laser, heat from the laser machining process may damage the substrate material 8, such as silicon, which surrounds the blind hole 40, creating a so-called heat-affected zone, or HAZ. Accordingly, substrate material 8 immediately surrounding the blind hole 40 may be cleaned by an etch process or other process before the next act. Larger sized openings may be cleaned by a wet etch process such as by etching with the aforementioned 6% TMAH in a propylene glycol solution. For smaller openings, a dry etch (reactive ion etch or RIE) may be required for effective cleaning. A combination of a wet etch and a dry etch may be used.

Figure 5:
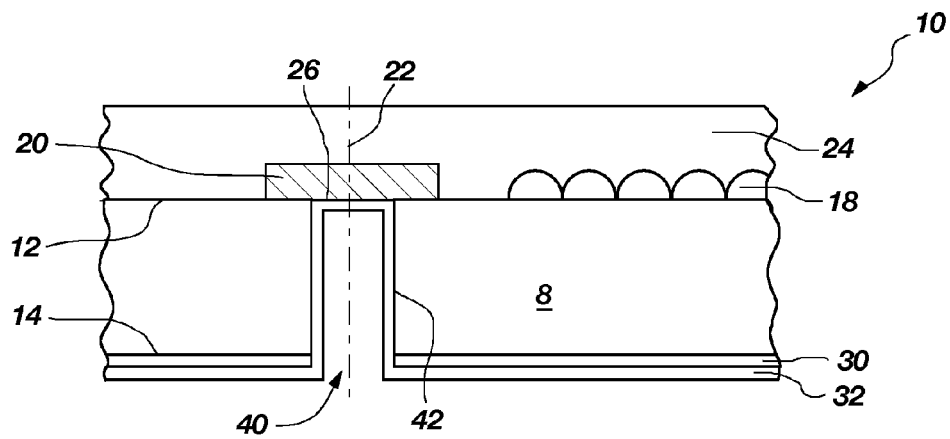
FIG. 5 is a cross-sectional side view of a portion of the example substrate structure of FIG. 4 following deposition of a second dielectric layer to coat the blind hole interior surfaces, in accordance with an embodiment of the present invention.

Following cleaning of the blind hole 40, the sidewalls 42 and terminus 34 of the blind hole 40 are coated with a passivation layer, which is called herein a "second oxide layer" 32. The second oxide layer 32 may be blanket-deposited or grown by methods well known in the art. Blanket deposition will cover the blind hole surfaces as well as the second surface 14. Deposition methods include, without limitation, chemical vapor deposition (CVD) and variations thereof; an example being plasma-enhanced chemical vapor deposition (PECVD), and low pressure chemical vapor deposition (LPCVD). The second oxide layer 32 may alternatively be grown by oxidation of the semiconductor material surface e.g., silicon surface in an oxidizing environment. Like the first oxide layer 30, the second oxide layer 32 may be an oxide, for example, silicon dioxide or other oxide, or a non-oxide e.g., an organic coating or other electrically insulative material. Second oxide layer 32 may comprise a layer of low silane oxide (LSO) deposited at a thickness ranging from about 0.1 µm to about 10 µm, more generally approximately 2 µm to 3 µm. This second oxide layer 32 is depicted in FIG. 5, wherein a blanket deposition method has covered the first oxide layer 30 on the second surface 14, and the sidewalls 42 and terminus 34 of the blind hole 40. As shown, the second oxide layer 32 covers the first oxide layer 30, and forms a continuous covering within the blind hole 40, electrically insulating the blind hole 40 from the bulk substrate material 8.

Figure 6:
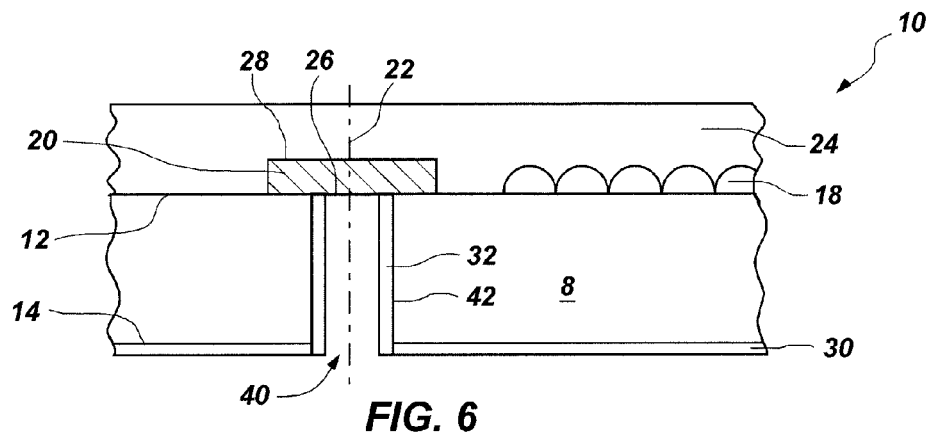
FIG. 6 is a cross-sectional side view of a portion of an example substrate structure of FIG. 5 following spacer etching of a portion of the second dielectric layer to expose the bond pad underside, in accordance with an embodiment of the present invention.

As shown in FIG. 6, an anisotropic, dry spacer etch of the second oxide layer 32 is effected, wherein the second oxide layer 32 is at least partially stripped from the first oxide layer 30 (on second surface 14) and substantially completely stripped from the underside 26 of the bond pad 20 within blind hole 40, exposing the bond pad 20 with blind hole 40. The second surface 14 remains passivated by any remaining portion of the second oxide layer 32 as well as the first oxide layer 30, and the sidewalls 42 of blind hole 40 are passivated by the second oxide layer 32. This etch is typically selective to the bond pad material and bond pad 20 is hardly etched.

Figure 7:
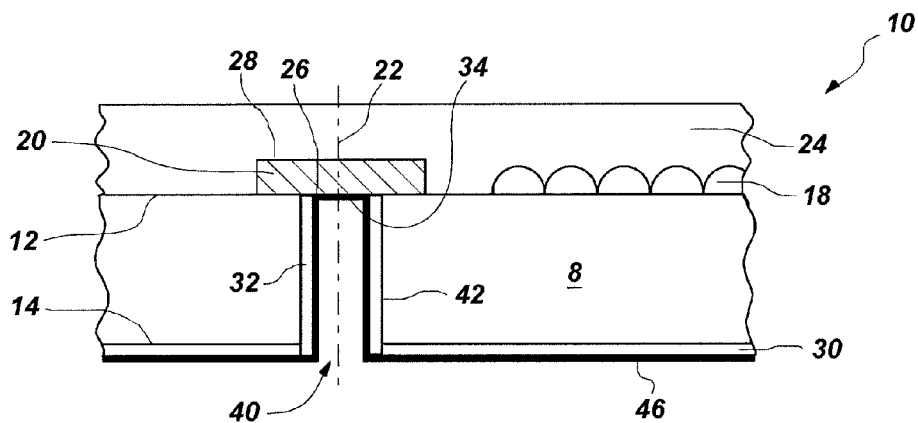
FIG. 7 is a cross-sectional side view of a portion of an example substrate structure of FIG. 6, following application of a metallic seed layer over exposed dielectric layers in accordance with an exemplary embodiment of the present invention.

The next general act described in FIG. 1 is depicted in FIG. 7, and comprises a blanket deposition of a metallic "seed" layer 46 of conductive material within the blind hole 40. The seed layer 46 enhances the adhesion of an interconnect metal such as, for example, copper, nickel, or a solder material to the second oxide layer 32 and to the exposed portion of the underside 26 of bond pad 20. The seed layer 46 may comprise, for example, tungsten, tantalum, copper, or other metals or metal alloys, or combinations thereof. As an example, seed layer 46 will be assumed to be tungsten, which is applied by any process that will deposit a thin tungsten layer on the second oxide layer 32 and the exposed portion of underside 26 of bond pad 20. Thus, for example, the seed layer 46 may be applied by electroplating or electroless plating, by PVD methods, or deposited as a pulse deposition layer (PDL) to coat the surfaces within blind hole 40. In usual practice, the method for depositing the seed material is a blanket deposition which also deposits a first seed layer 46 over the first oxide layer 30 on the back surface 14 as well, requiring a later act to remove the seed layer 46 from all but the areas to be filled with solder or other metal. Typically, the seed layer 46 has a thickness of about 0.5 µm to 2 µm.

Figure 8:
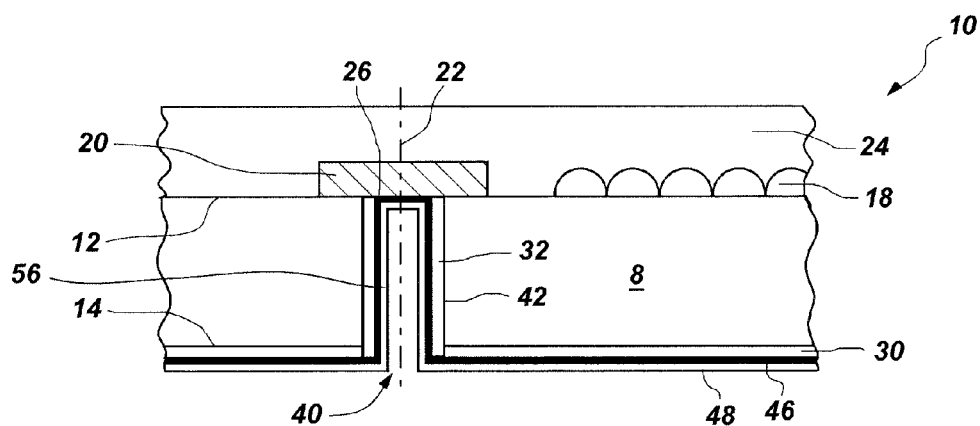
FIG. 8 is a cross-sectional side view of a portion of an example substrate structure of FIG. 7 following application of a metal layer over the metallic seed layer, in accordance with an embodiment of the present invention.

It has been found that it may be advantageous to provide two (or more) materials as seed layers. As shown in FIG. 8, a second seed layer 48 may be blanket deposited over all regions of the first seed layer 46. The second seed layer 48 may be a metal such as copper, nickel, or other metal which enhances the attraction of a conductive metal(s) to the sidewalls 42 and to the underside 26 of bond pad 20. For example, the use of a second seed layer 48 of nickel electroplated or electroless plated atop a first seed layer 46 of tungsten is advantageous for forming a blind wafer interconnect (BWI) 50 (FIG. 12) having a core space 56 filled with a solder, copper or nickel.

Figure 12:
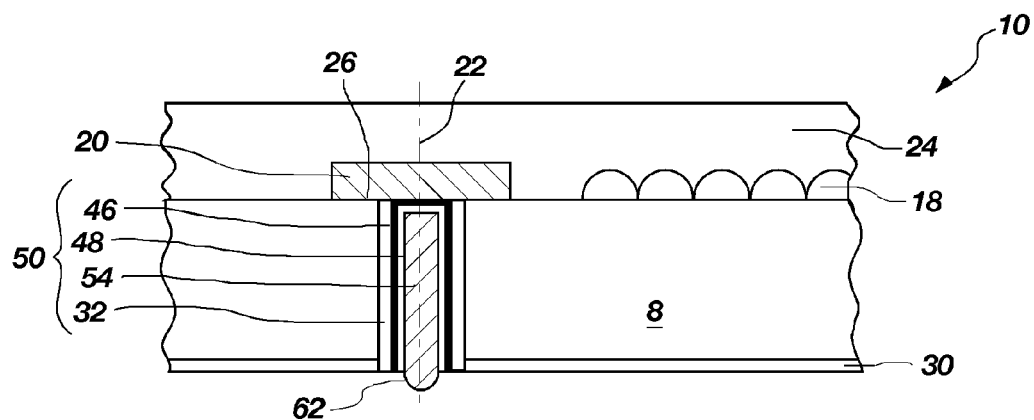
FIG. 12 is a cross-sectional side view of a portion of an example substrate structure of FIG. 11 following filling of a cleaned blind hole with a conductive material in electrical contact with a bond pad to form a BWI in accordance with an embodiment of the present invention.

As depicted in FIG. 8, metal seed layer 48, which may act as a barrier layer instead of or in addition to acting as a seed layer, may be plated by either electroless or electroplating over the first seed layer 46 within blind hole 40 and on the second surface 14. The method may utilize copper or nickel at a layer thickness of about 5 µm. Typically, the layer thickness may be approximately 3 µm or less. Methods for electroless plating of metal are well known in the electronics art. In an exemplary electroless plating of nickel over a first seed layer 46, the substrate structure 10 may be first cleaned and then immersed in a bath containing an electroless nickel plating solution to form the nickel layer of conductive material 54 (FIG. 12). The second layer 48 of, e.g., nickel acts as a wetting surface enabling molten solder to more effectively fill the core space 56 of blind hole 40, as well as acting as a barrier layer. A wide variety of electroless nickel plating solutions are known in the art, such as electroless nickel-phosphorus plating solutions or electroless nickel-boron plating solutions. Such electroless nickel plating solutions are commercially available, such as NicPac 2.1, NicPac 2.2, and NicPac 2.3, which are available from PacTech GmbH (Berlin, Germany) and RONAMAX® SMT, DURAPOSIT®, NIPOSIT®, NIPLATE™, which are available from Rohm & Haas Electronic Materials (Philadelphia, Pa.). These electroless nickel plating solutions include nickel salts such as nickel sulfate, nickel chloride, nickel bromide, nickel fluoroborate, nickel sulfonate, nickel sulfamate, and nickel aryl sulfonates, as a source of the nickel ion. The electroless nickel solution may also include a reducing agent, an alkali for pH control, and complexing agents. During electroless plating, nickel ions are reduced to nickel by oxidation of the reducing agent. The nickel plating solution is maintained at a temperature range from about 60° C. to about 100° C. Alternatively, as noted above, electroplating may be employed to deposit metal seed layer 48, such methods being well known to those of ordinary skill in the art.

The concentration of nickel ions in the electroless plating solution, the plating temperature, and the time of exposure (immersion time) are controlled to provide a desired thickness of seed layer 48 e.g., plated nickel over the first seed layer 46 within blind hole 40.

Figure 9:
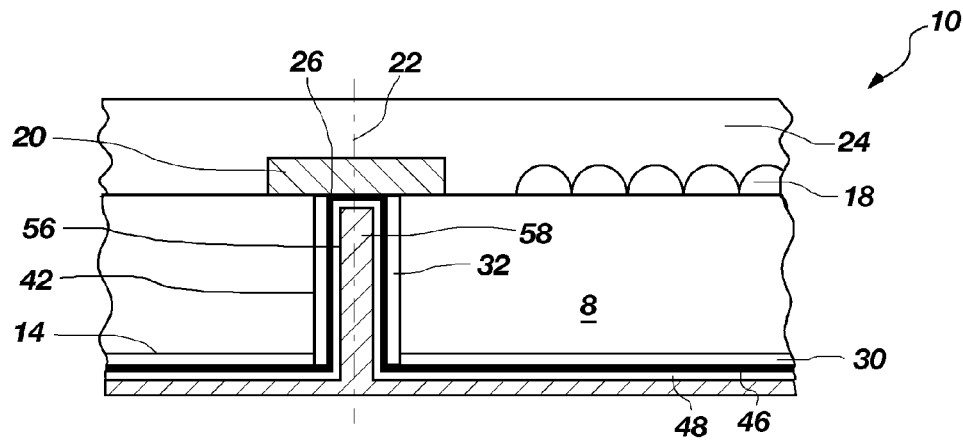
FIG. 9 is a cross-sectional side view of a portion of an example substrate structure of FIG. 8 following blanket deposition of a photoresist material on the back side to fill the blind hole thereof, in accordance with an embodiment of the present invention.

Regardless of the number of seed or other metal layers which are applied, the next act comprises a blanket deposition of a sacrificial material, which may be in the form of a resist material or other polymer 58, filling the empty core space 56 and covering seed layer 48 on the second surface 14. This act is illustrated in FIG. 9. The resist material or other polymer 58 may be any of known resist materials which is readily removed by chemical-mechanical planarization (CMP) and/or by a simple etch act, the latter removing resist from the blind hole 40. A resist material may be a positive or negative photoresist. The resist material or other polymer 58 prevents foreign particles from entering the blind hole 40 (including empty core space 56) and contaminating the BWI. The resist material or other polymer 58 also acts to prevent over-abrasion of oxide layers at the exposed end 62 of the BWI, leading to possible short circuits between the BWI and substrate material 8.

Figure 10:
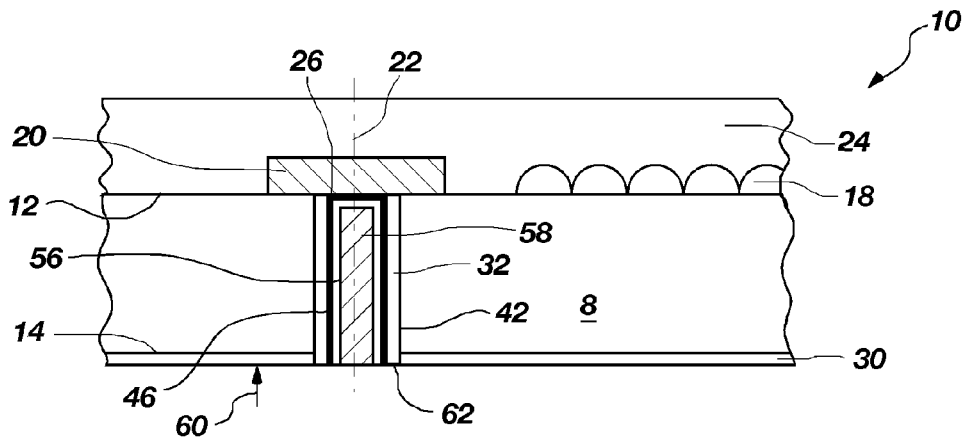
FIG. 10 is a cross-sectional side view of a portion of an example substrate structure of FIG. 9 following removal of photoresist material, metallic seed layer, and metal layer on a flat back side surface, in accordance with an embodiment of the present invention.

Following deposition of the resist material or other polymer 58, seed layers 46, 48 and overlying resist material or other polymer 58 may be removed from wafer back side surface 14 to stop on oxide layer 30 by an abrasive technique such as chemical-mechanical planarization (CMP) or back grinding, as depicted at 60 in FIG. 10. CMP processes and apparatus are well developed in the art, comprising mechanical abrasion with etching to achieve highly planar surfaces, typically±about 2 µm to 4 µm.

Figure 11:
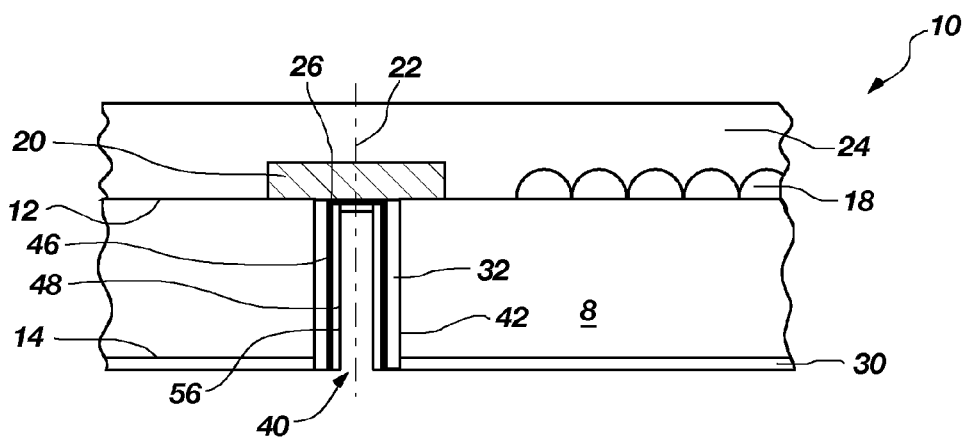
FIG. 11 is a cross-sectional side view of a portion of an example substrate structure of FIG. 10 following removal of photoresist material from a blind hole, in accordance with an embodiment of the present invention.

Resist material or other polymer 58 is then readily removed from within the blind hole 40 by stripping with an appropriate stripper, resulting in the configuration shown in FIG. 11. The stripper or another fluid may be used to remove foreign materials in the blind hole 40.

In an another approach, the resist material or other polymer 58 and seed layers 46, 48 on second surface 14 may be removed by an etching process.

As depicted in FIG. 12, the core space 56 is then filled with one or more conductive materials 54, which may comprise solder, a metal, metal-containing polymer, metal-filled polymer, or other conducting materials, resulting in a blind wafer interconnect (BWI) 50. The BWI 50 is considered herein to comprise all of the structure within blind hole 40, including second oxide layer 32, first and second seed layers 46, 48, and conductive material 54. The BWI 50 is intimately connected to the underside 26 of bond pad 20 to provide continuous electrical connection. In the example of FIG. 12, the conductive material 54 is shown to be a conventional solder, which is wetted very well by a seed layer 48 formed of nickel or copper.

Various methods of solder filling may be utilized, but some methods may be limited to blind holes 40 of larger diameter or lower aspect ratio. Thus, useful solder filling methods for filling small (i.e., less than about 10 μm to 50 μm diameter) blind holes 40 of the invention may include drag soldering, hot air solder leveling (HASL), chemical vapor deposition (CVD), physical vapor deposition (PVD), sputtering, electroless deposition, electroplating, and vacuum soldering, depending upon the blind hole dimensions 36, 38.

Alternatively, aluminum may be sputtered as a portion or all of the conductive material 54, particularly where the bond pad 20 is fanned of aluminum. Since sputter coating and CVD processes are relatively slow, a portion of the conductive material 54 may be plated using an electroless or electrolytic plating process as known in the art, which is faster than CVD or sputtering. This method is particularly advantageous where solder is first applied, followed by plating of nickel or copper.

For blind holes 40 of less than about 50 μm diameter 38, an improved wave soldering apparatus as disclosed in U.S. patent application Ser. No. 11/140,420 to Kirby et al., filed May 27, 2005, now U.S. Pat. No. 7,918,383, issued Apr. 5, 2011, (hereinafter the "Kirby et al. application") and claiming the benefit of U.S. Provisional Patent Application Ser. No. 60/606,798, filed Sep. 1, 2004, may be used to solder-fill the blind holes 40 with conductive material 54 in the form of a solder. Using the disclosed apparatus and associated methods, molten solder forms a vertical (or near vertical) stream impinging on the blind holes 40 to be filled. The substrate structure 10 may be held by a fixture (not shown) in a vertical, near-vertical (±about 45°), or other suitable orientation to be impinged by molten solder to fill blind holes 40. The method is very rapid and effective for void-free filling of small blind holes 40 with solder. The method includes acts of repositioning the substrate structure 10 in one or more different orientations and reflowing the solder to ensure complete filling of each blind hole 40. The disclosure of the Kirby et al. application is incorporated herein by reference.

Another solder filling method which may be used is a technology offered by Pac Tech GmbH of Nauen, Germany wherein solder balls are "shot" into the blind hole 40 and melted to reflow. The acts are repeated as necessary to completely fill the hole, and the reflow may be conducted in a vacuum to prevent air from being trapped in the blind hole 40. Solder paste has also been used to fill blind holes in the prior art. However, with small diameter blind holes 40, having a diameter <about 50 μm, the use of solder paste is not generally effective, because its high concentration of flux causes voids or "keyholes" in the core space 56 of the BWI 50.

In FIG. 12, the conductive material 54 is depicted with a rounded, exposed end 62.

Figure 13:
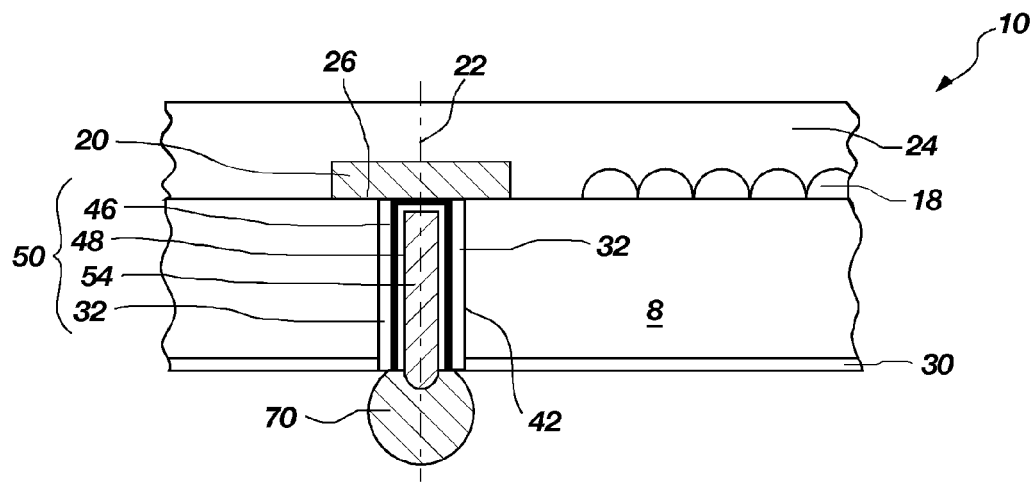
FIG. 13 is a cross-sectional side view of a portion of an example substrate structure of FIG. 12 following attachment of a solder ball to the exposed end of a BWI in accordance with an embodiment of the present invention.

As shown in FIG. 13, a solder ball 70 or solder column (not shown) may be joined to the exposed end 62 of the BWI 50, typically by conventional solder reflow.

Figure 14:
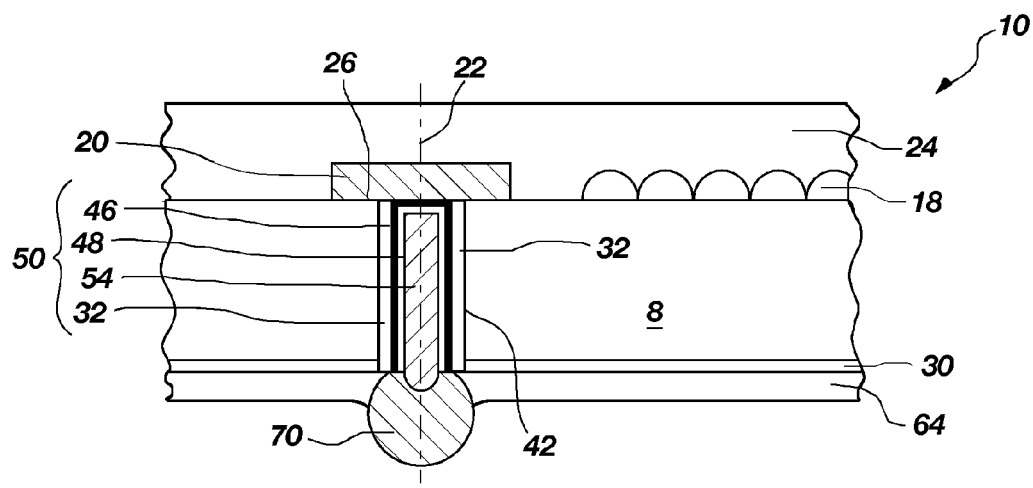
FIG. 14 is a cross-sectional side view of a portion of an example substrate structure of FIG. 13 following application of a protective passivation layer on the back side thereof in accordance with an embodiment of the present invention.
Figure 23:
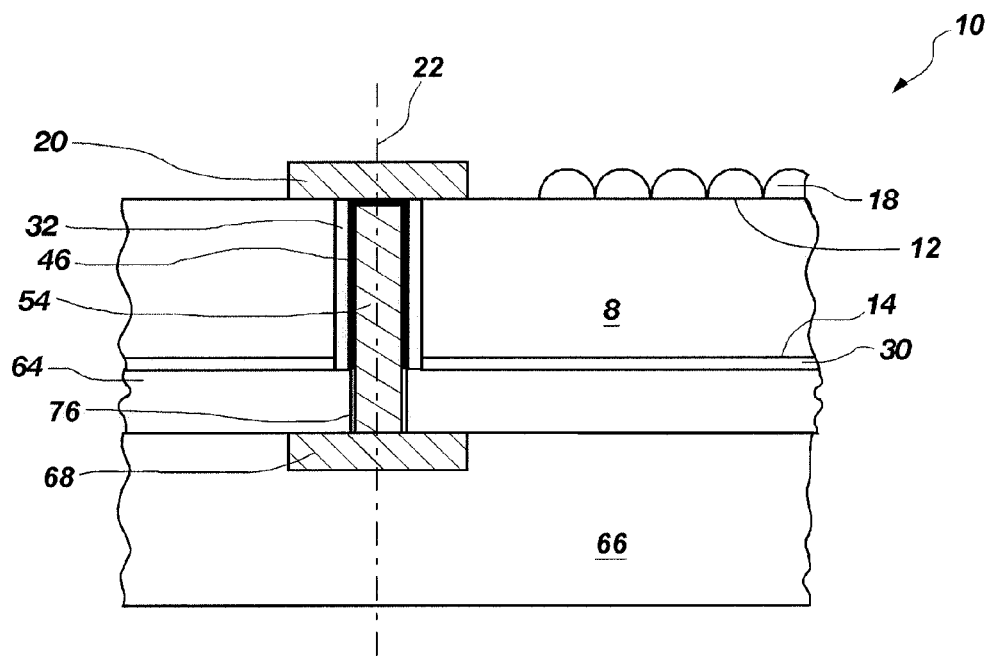
FIG. 23 is a cross-sectional side view of the substrate structure of FIG. 22 following optional acts of resist removal, plating the BWI end, depositing a passivation layer over the back side of the first substrate structure, and attaching the BWI end to a bond pad of a second substrate structure in accordance with the present invention.
Figure 24:
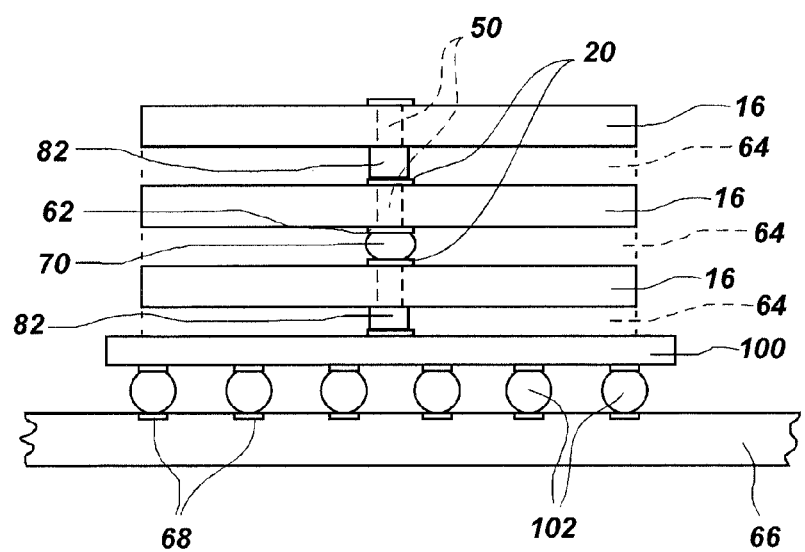
FIG. 24 is a side elevation of a multi-chip module comprising a plurality of semiconductor dice embodying the present invention stacked on an interposer substrate and mounted to a higher level substrate.

In another aspect of the invention, pictured in FIG. 14, a passivation layer 64 may then be applied by conventional means (such as spin-on) to the first oxide layer 30 on second surface 14, surrounding the solder balls 70 or other connectors, which are attached to BWI 50. Passivation layer 64 may be readily applied and acts to maintain the solder balls 70 in place during connection to a second substrate structure 66 (FIGS. 14B, 23, and 24). Passivation layer 64 may comprise any passivating material for packaging which may be spin-coated or otherwise applied on a wafer scale, such as a polymer including polyimide and the like, known in the art.

Figure 14A:
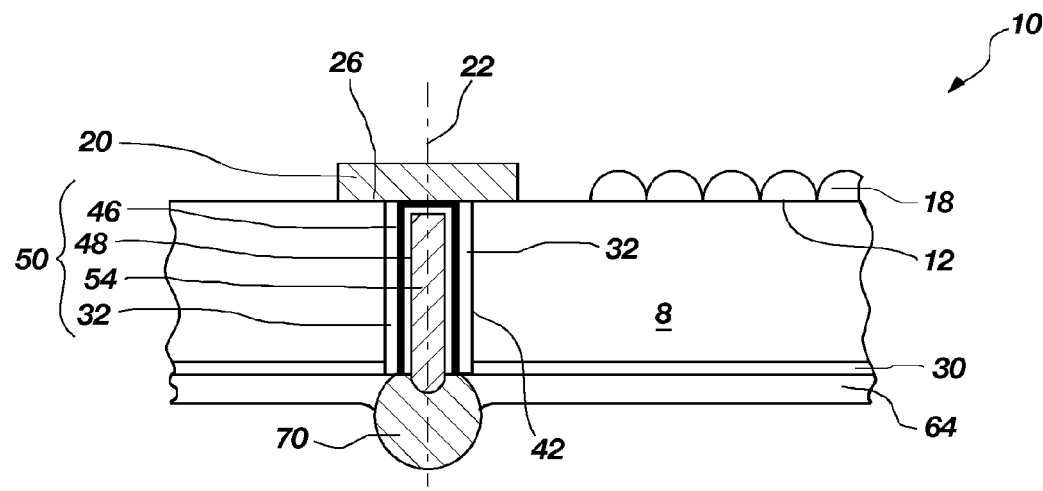
FIG. 14A is a cross-sectional side view of a portion of an example substrate structure of FIG. 14 following removal of a carrier support from the active surface in accordance with an embodiment of the present invention.
Figure 14B:
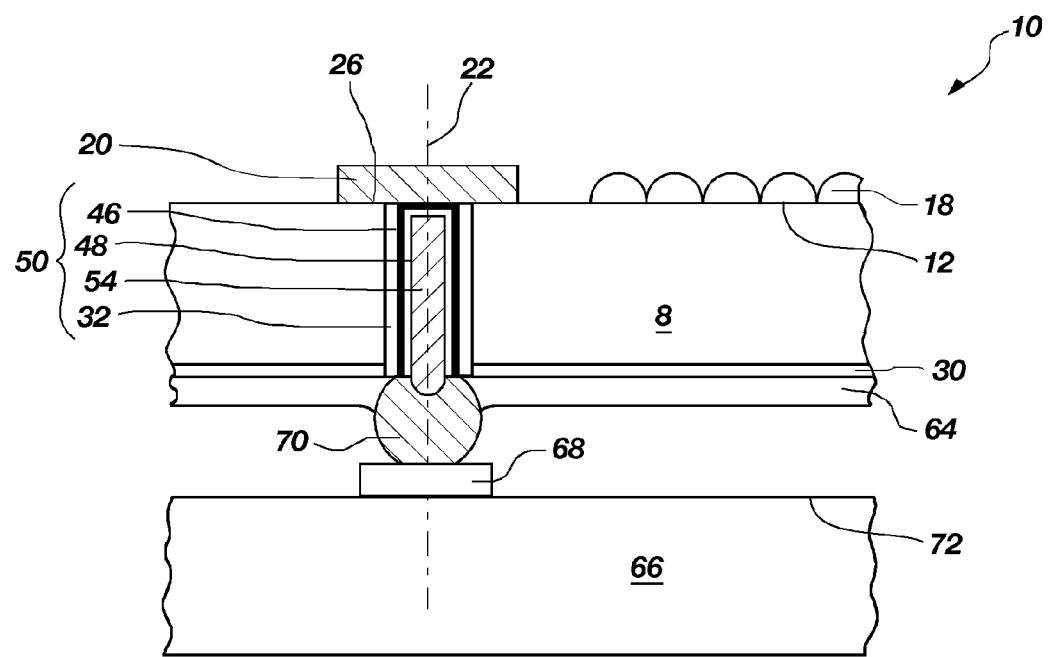
FIG. 14B is a cross-sectional side view of a portion of an example substrate structure of FIG. 14A following conductive attachment of solder balls thereon to bond pads of a second substrate structure in accordance with an embodiment of the present invention.

As shown in FIG. 14A, the layer 24 is removed from the first surface 12 of substrate structure 10 to permit a less impeded exposure of the microlens array 18.

A substrate structure 10 formed according to the invention is shown attached to a bond pad 68 on an upper surface 72 of second substrate structure 66 by solder ball 70 in FIG. 14B. Second substrate structure 66 may be another die, wafer, test apparatus, circuit board or other substrate structure, for example.

Figure 15:
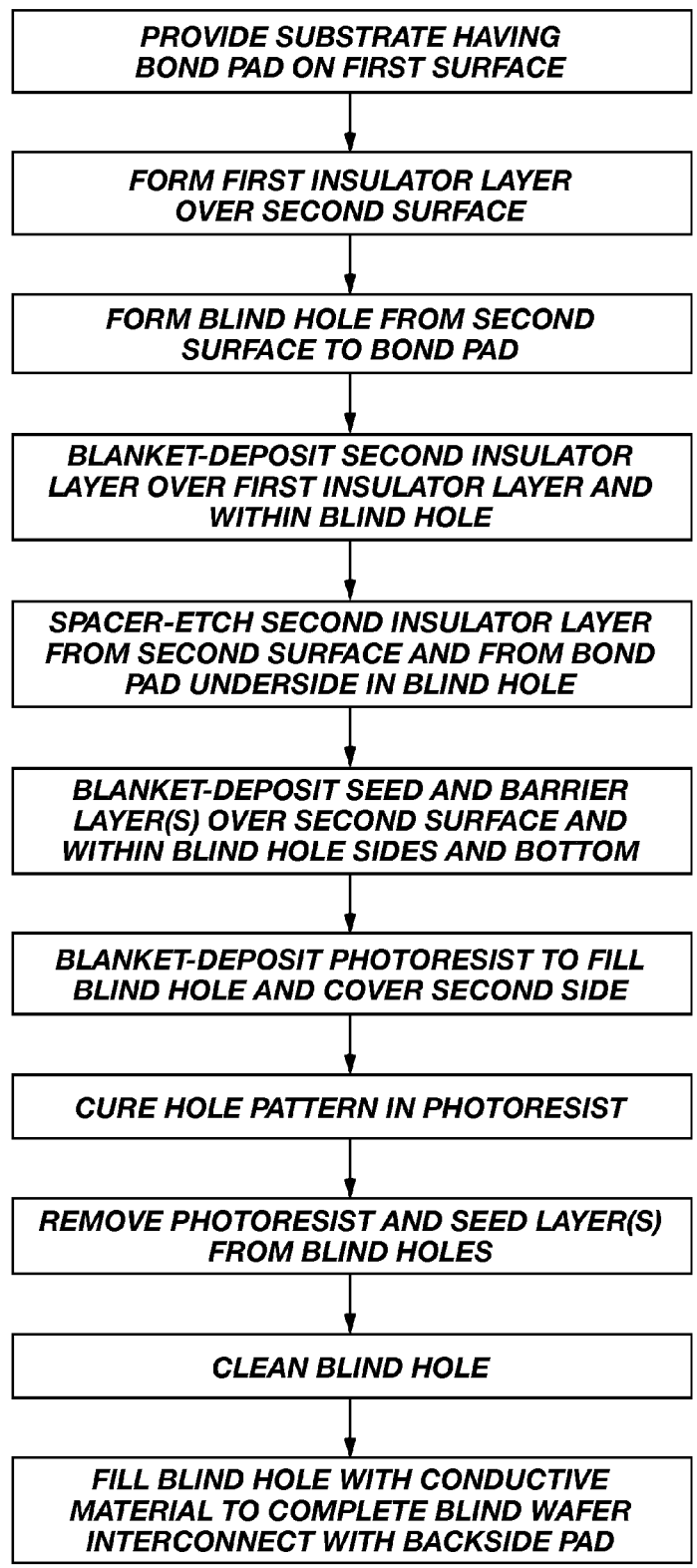
FIG. 15 is a flowchart indicating acts to form a blind wafer interconnect in accordance with another embodiment of the present invention.

In FIG. 15, another embodiment of the invention is described in concert with the acts illustrated in FIGS. 15A through 21. It is understood that the acts shown in FIGS. 2 through 7 have already been completed, providing a substrate structure 10 with a blind hole 40 lined with second oxide layer 32 overlain by seed layer 46. For the sake of illustration, only one seed layer (seed layer 46) is shown, but the embodiment may be formed with an additional, second seed layer 48, for example.

Figure 15A:
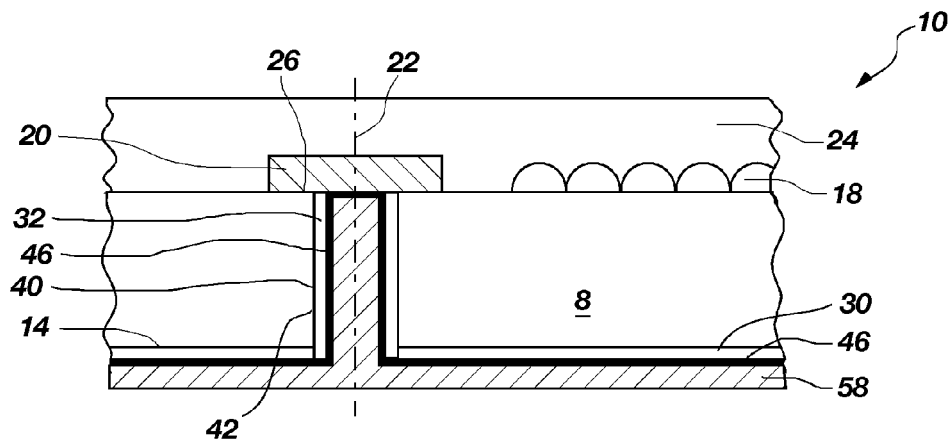
FIG. 15A is a cross-sectional side view of a portion of an example substrate structure of FIG. 7 following blanket deposition of a photoresist material on the back side to fill the blind hole thereof, in accordance with another embodiment of the present invention.

As shown in FIG. 15A, the second surface 14 of substrate structure 10 from the act of applying seed layer 46 in FIG. 7 is blanket-covered with a photoresist material or polymer 58 which fills blind hole 40 and covers the seed layer 46 on second surface 14. Portions of the polymer 58 are exposed and developed in a pattern for forming a pad-shaped opening 59 surrounding the exposed end of each core space 56 (see FIG. 16). The pad-shaped opening 59 may have any desired shape and size. To form a ball-grid array, a desired shape and size of pad-shaped opening 59 may depend upon BWI spacing (pitch), solder ball size, and other factors to ensure precise electrical connections and high reliability while meeting cost objectives. It is noted that bond pads 20 on the first surface 12 of substrate structure 10 may be optionally connected by, e.g., solder balls to a third substrate structure (see FIG. 24) superimposed on the first surface 12. Thus, a plurality of dice 16 may be fully interconnected to each other and/or to a circuit board by BWIs 50, without the need for wire bonding.

Figure 16:
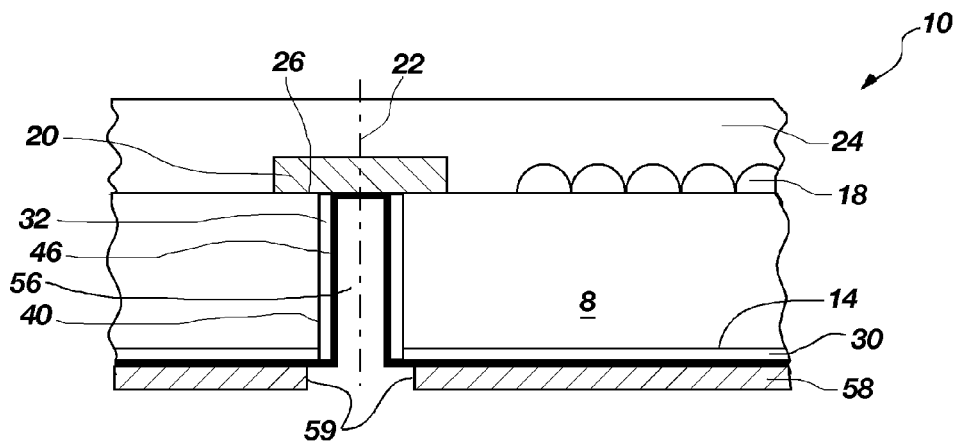
FIG. 16 is a cross-sectional side view of a portion of an example substrate structure of FIG. 15A following removal of photoresist material from the blind hole and a portion of the back side surrounding the blind hole, in accordance with another embodiment of the present invention.

As shown in FIG. 16, the undeveloped resist material or polymer 58 may be removed from the core space 56 (including pad-shaped opening 59) by a conventional resist stripper appropriate for the resist material or polymer 58, and cleaned as necessary by techniques well known in the art.

Figure 17:
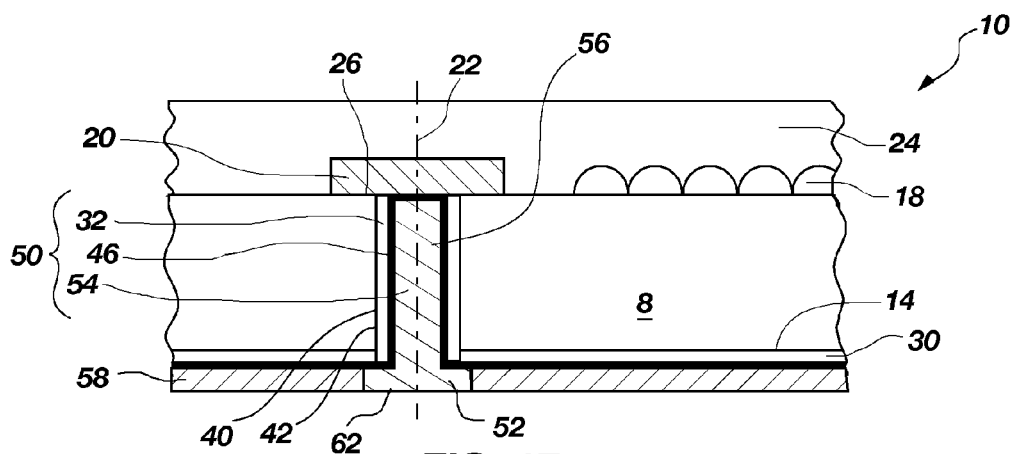
FIG. 17 is a cross-sectional side view of a portion of an example substrate structure of FIG. 16 after filling the blind hole with a solder or other electrically conductive material, in accordance with another embodiment of the present invention.

As depicted in FIG. 17, a conductive material 54 such as a metal is introduced into the core space 56 of blind hole 40 to form a BWI 50 with an exposed, enlarged end 62 configured as pad 52. The BWI 50 of this embodiment may be desirably formed with a conductive metal such as copper, for example. The conductive material 54 may be deposited by electroplating or electroless plating, for example, or by other well-known deposition methods.

Figure 18:
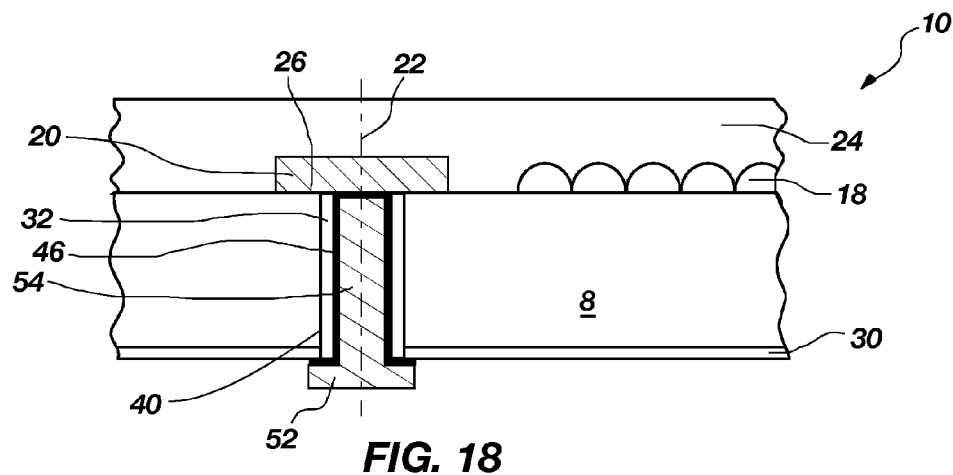
FIG. 18 is a cross-sectional side view of an example substrate structure of FIG. 17 following cleaning of photoresist material from the back side of the substrate structure, in accordance with another embodiment of the present invention.
Figure 19:
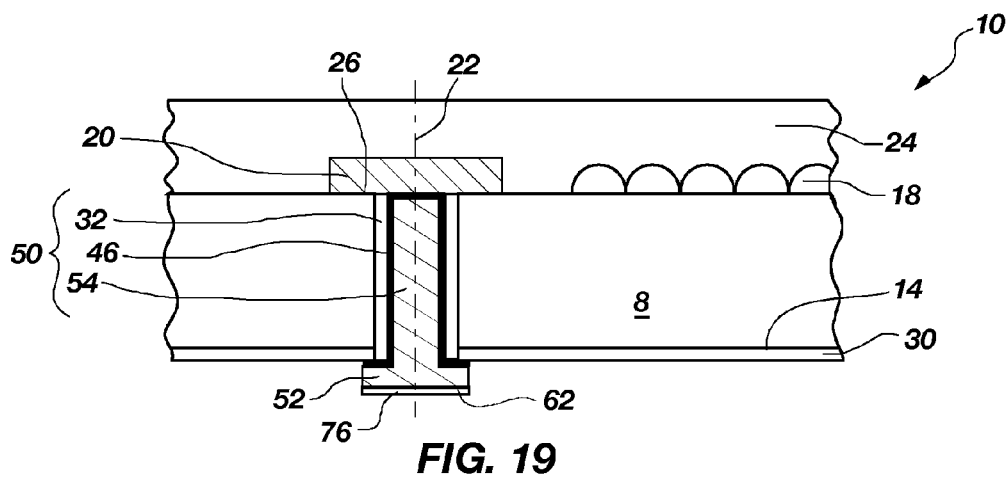
FIG. 19 is a cross-sectional side view of an example substrate structure of FIG. 18 following application of a wetting material onto the exposed end of the blind wafer interconnect (BWI), in accordance with another embodiment of the present invention.
Figure 20:
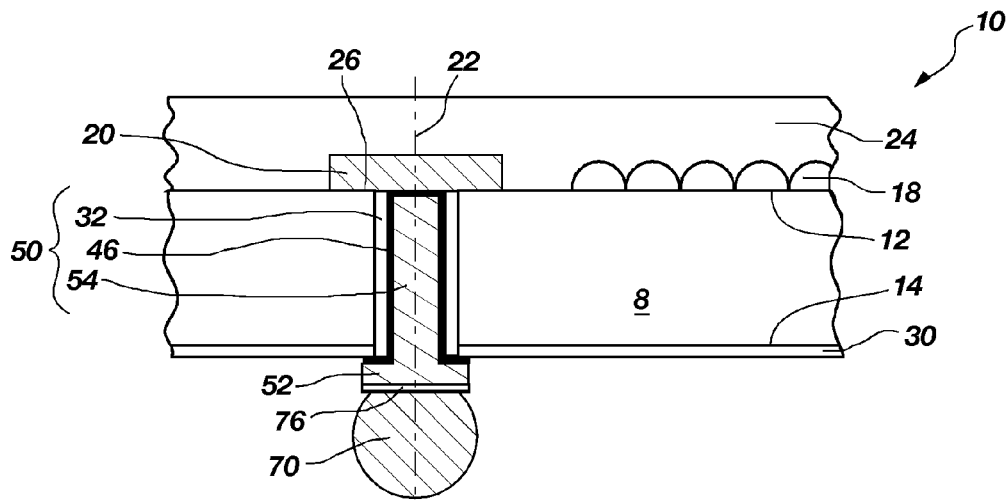
FIG. 20 is a cross-sectional side view of an example substrate structure of FIG. 19 following attachment of a solder ball to the wetting material on the exposed end of the BWI, in accordance with another embodiment of the present invention.

As depicted in FIG. 18, the remaining resist material or polymer 58 is stripped and one or more seed layer(s) 46, 48 outside of the BWI 50 are removed by etching, leaving passivation layer (second oxide layer) 32 covering the first oxide layer 30.

Optionally, the exposed end 62 of BWI 50 may be coated with one or more thin layers 76 of material, such as prior to removal of the remaining resist material or polymer 58, to slow or prevent oxidation of pad 52, and to enhance attachment or formation of a solder ball 70. Layer or layers 76 may comprise copper, nickel, gold or other material, and are shown collectively as a single layer in FIG. 19. One suitable combination of material layers is nickel followed by gold, for oxidation prevention and good wettability and adhesion to solder, such as a PbSn solder or a lead free solder, such as a SnAgCu solder. The coating of layer 76 may be deposited by electroplating, electroless plating, or other deposition process which will provide a non-oxidizing, highly wettable pad 52 upon which a solder ball 70 may be mounted (see FIG. 20).

Figure 21:
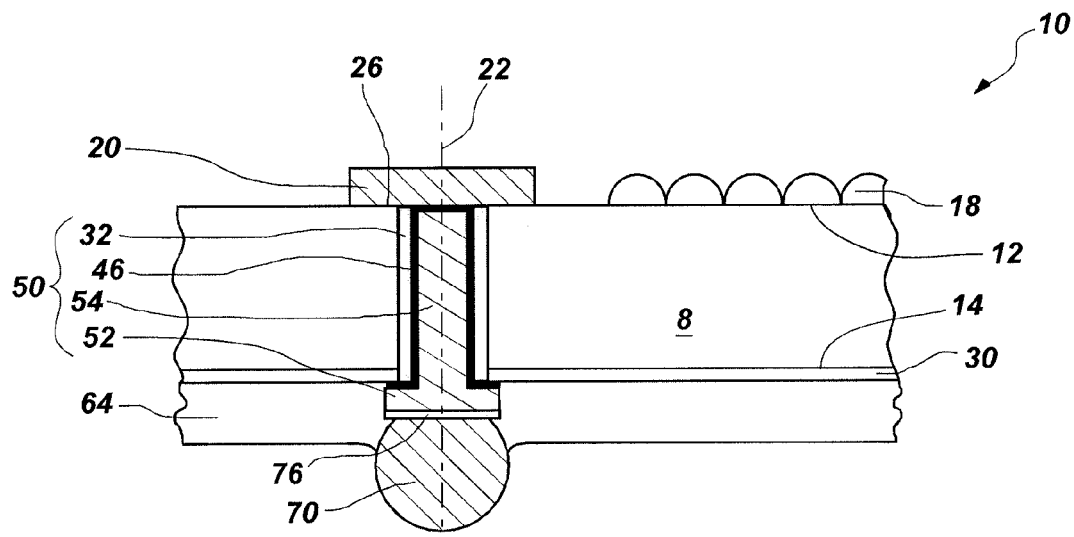
FIG. 21 is a cross-sectional side view of an example substrate structure of FIG. 20 following application of a passivation layer between solder balls on the back side, in accordance with another embodiment of the present invention.

Optionally, as shown in FIG. 21, a passivation layer 64 may be formed on the first oxide layer 30, surrounding and supporting the solder balls 70. This layer 64 may comprise an insulative polymer such as spin-deposited polyimide, for example.

Figure 22:
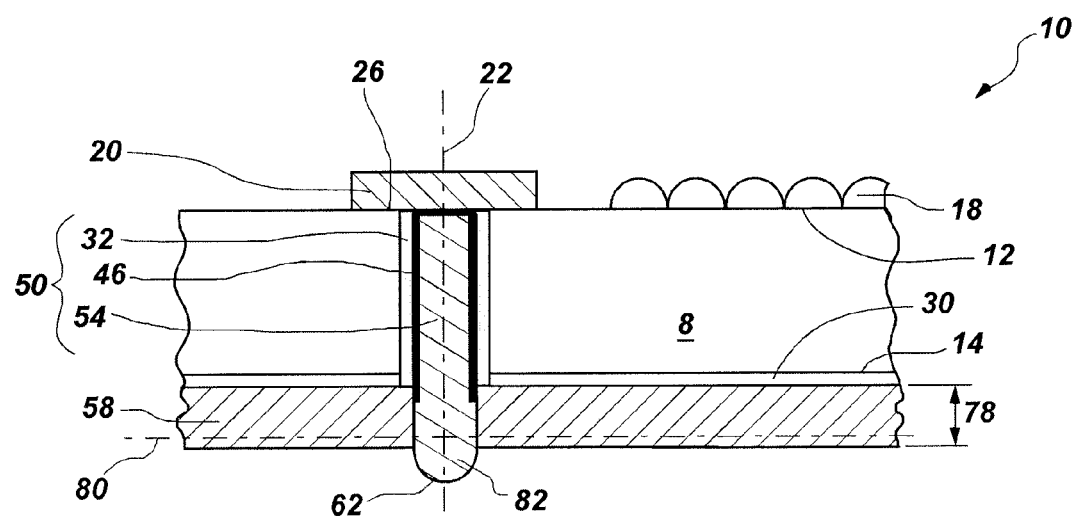
FIG. 22 is a cross-sectional side view of an example substrate structure with a blind wafer interconnect (BWI) in accordance with yet another embodiment of the present invention.

Turning now to FIGS. 22 and 23, which describe a further embodiment of the invention, as shown, the conductive material 54 of BWI 50 is formed as a slug projecting from the second surface 14 sufficient to enable direct electrical contact with a second substrate structure 66 (see FIG. 23) such as a circuit board, another wafer or die, a test apparatus or some other structure. The substrate-to-substrate connection may be completed without wire-bonding and without solder balls, solder columns and the like.

In forming a BWI 50 with a slug end 82, initial acts are as in previous embodiments. However, in this embodiment, the resist material or polymer 58 on first oxide layer 30 has a generally greater thickness 78, for example, about 20 μm to about 50 μm, so that the opening 59 in the resist layer may act as a cavity or recess within which the projecting slug end 82 is formed. As shown in solid lines, the conductive material 54 of the BWI 50 may be formed to a substantially constant diameter or lateral extent from the underside 26 of bond pad 20 to its distal, slug end 82. Optionally, slug end 82 may be formed to a larger diameter or lateral extent as shown in FIG. 22.

Further optional modifications to the method are shown in FIG. 23, as follows: First, all of the slug ends 82 on a substrate (e.g., wafer 10) may be planarized by, for example, CMP after curing of the resist material or polymer 58 to remove excess length of slug ends 82 and a portion of the resist material or polymer 58 to CMP line 80 (see FIG. 22). The remaining resist material or polymer 58 may then be removed, leaving all slug ends 82 planarized relative to each other, as shown in FIG. 23. Planarization of the hundreds or thousands of BWIs 50 (slug ends) on a wafer will lie within about ±2 μm to 5 μm across the surface of the wafer and, of course, much less across a single die 16 (see FIG. 1A) singulated from the wafer.

Optionally, the slug ends 82 may be coated with one or more layers 76 of metal (gold, copper or nickel, etc.) as previously described and, if desired, a thin layer of solder may be applied.

Optionally, as shown in FIG. 23, a relatively thick layer 64 of passivating material may be applied to the first oxide layer 30, such as a spin-deposited polyimide, to act as an underfill between adjacent substrate structures 10 and substrate structures 66.

Thus, FIG. 23 depicts a slug end 82 of a substrate structure 10 (imager die) in electrical connection with a terminal pad or other conductive structure 68 of a second substrate structure 66, for example, a carrier substrate in the form of a printed circuit board.

In FIGS. 25 through 30, another embodiment of the invention is described. It is understood that the acts shown in FIGS. 2 through 6 have already been completed, providing a substrate structure 10 with a blind hole 40 lined with second oxide layer 32 and the underside 26 of bond pad 20 exposed.

Figure 25:
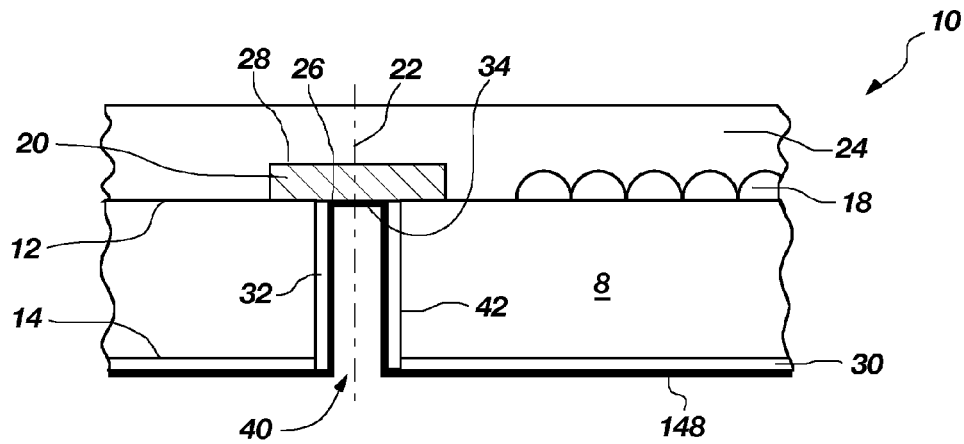
FIGS. 25 through 30 illustrate another variation of the methods of the present invention, commencing after the acts depicted in FIGS. 1A through 6 of the drawing figures.

As depicted in FIG. 25, a metal layer 148, may be deposited by, for example, PVD and electroplating, within blind hole 40 and on the second surface 14. The method may utilize copper as metal layer 148 at a layer thickness of about 5 μm, although the use of other metals and alloys is within the scope of the present invention. Methods for physical vapor deposition, or sputtering, as well as electroplating, of metal are well known to those of ordinary skill in the electronics art.

Figure 26:
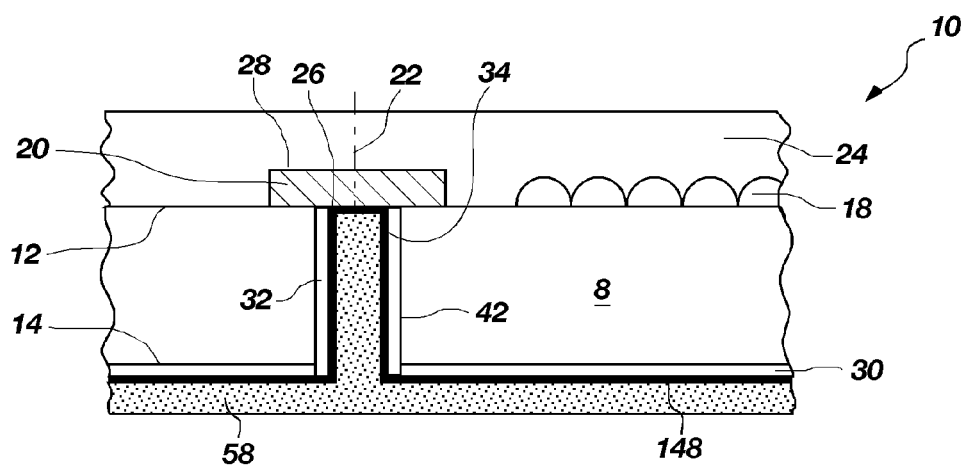

The next act comprises a blanket deposition of a sacrificial material in the form of a resist material or other polymer 58, filling the blind hole 40 (including empty core space 56) and covering metal layer 148 on the second surface 14. This act is illustrated in FIG. 26. The resist material or other polymer 58 may be any of known resist materials which is readily removed by chemical-mechanical planarization (CMP) and/or by a simple etch act, the latter removing the resist or other polymer 58 from the blind hole 40. If a resist material is employed, it may be a positive or negative photoresist. The resist material or other polymer 58 prevents foreign particles from entering the blind hole 40 (including empty core space 56) and contaminating the BWI. The resist material or other polymer 58 also acts to prevent over-abrasion of oxide layers at the exposed end of the BWI, which might lead to possible short circuits between the BWI and substrate material 8.

Figure 27:
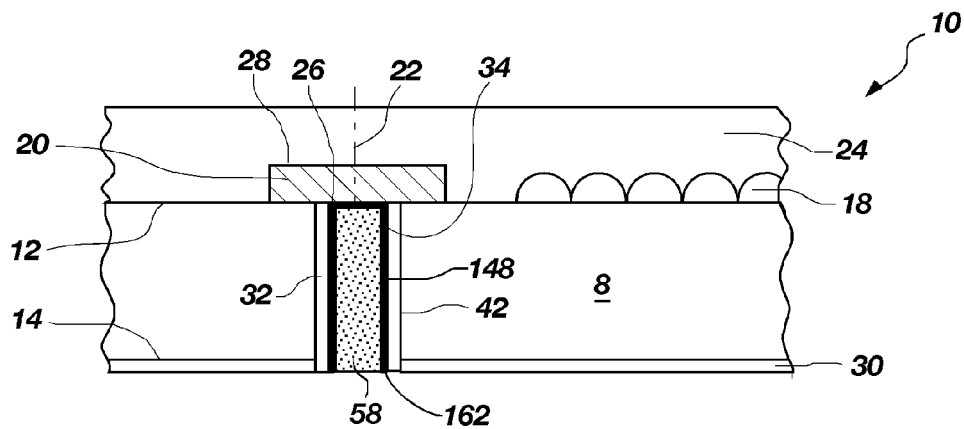

Following deposition of the resist material or other polymer 58, metal layer 148 and overlying resist material or other polymer 58 may be removed from wafer back side surface 14 to stop on oxide layer 30 by an abrasive technique such as chemical-mechanical planarization (CMP) or back grinding, as depicted in FIG. 27. CMP processes and apparatus are well developed in the art, comprising mechanical abrasion with etching to achieve highly planar surfaces, typically ± about 2 μm to 4 μm.

Figure 28:
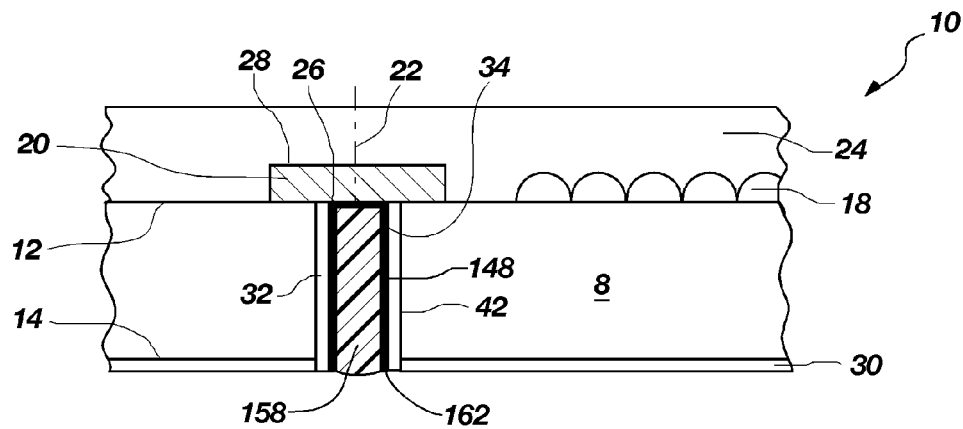

Resist material or other polymer 58 is then readily removed from within the blind hole 40 by stripping with an appropriate stripper, and blind hole 40 is filled with a dielectric material 158, for example, a spin-on dielectric comprising a polyimide, another polymer or other readily flowable dielectric material, resulting in the configuration shown in FIG. 28. Any excess dielectric material 158 covering an exposed annular end 162 of annular metal layer 148 of the BWI may be removed.

Figure 29:
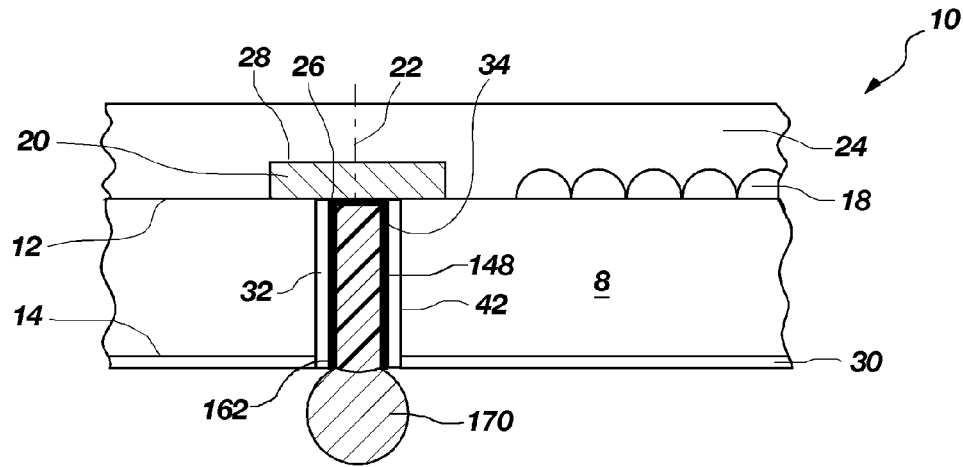

A metal or other conductive bump 170 may then be placed on and bonded to the exposed annular end 162 of annular metal layer 148, as depicted in FIG. 29. For example, a solder bump 170 may be disposed and reflowed to bond to exposed end 162. Alternatively, another metal or alloy bump, ball, pillar or stud may be employed, or a conductive or conductor-filled epoxy bump, ball, pillar or stud.

Figure 30:
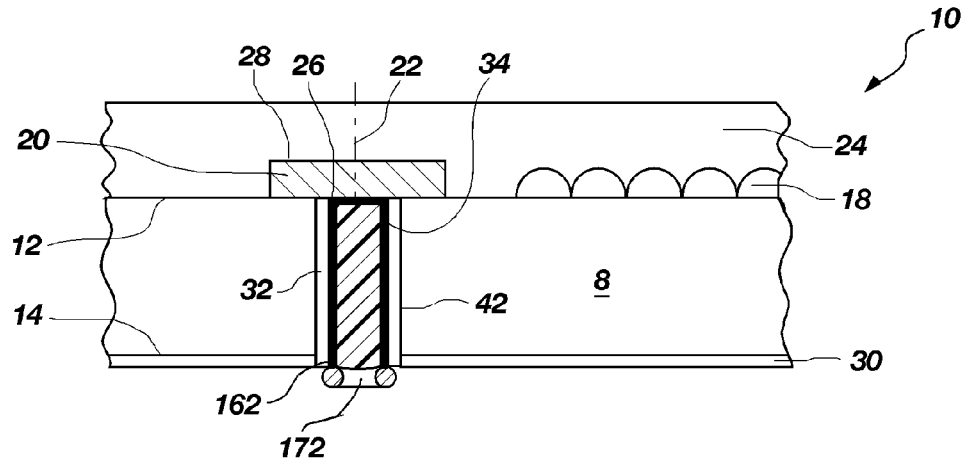

As another approach, a solder ring 172 may be placed on and bonded to, by reflow, exposed annular end 162 of annular metal layer 148, as depicted in FIG. 30.

As further depicted in FIG. 24, a plurality of dice 16 incorporating BWIs according to the present invention may be stacked and connected to conductive structures 68 of another substrate structure 66, either directly as depicted in FIG. 23, or through an interposer 100 bearing an array of discrete conductive elements 102 depicted as solder balls (although other conductive elements as previously mentioned herein may be employed). As shown, the upper surfaces of bond pads 20 on first surfaces 12 of dice 16 in the stack may be connected to solder balls 70 of a superimposed die 16 in communications with BWIs 50, shown by broken lines, at pad-like ends 62 thereof, or to projecting slug ends 82 of BWIs 50 of a superimposed die 16. If the former approach is used, bond pads 20 may be plated previously with one or more metal layers to enhance solder wettability, whereas if the latter approach is used, a thin interface bonding layer of solder or a conductive or conductor-filled epoxy may be applied to bond pads 20 prior to contact with slug ends 82, followed by reflow or curing of the interface layer to mechanically and electrically connect the slug ends 82 to bond pads 20. Relatively thick layers of passivating material 64 (shown in broken lines) may be disposed between adjacent dice 16 and between lowermost die 16 and interposer 100 to function as an underfill.

As already indicated, methods of the invention avoid the use of wire bonding. In addition, the invention enables assembly of stacked dice and multi-chip modules (MCMs) at high speed and with enhanced accuracy while reducing the occurrence of defects. The method is designed to be used at the wafer level, thus saving both manufacturing time and costs, including materials costs. Thus, density of a multi-chip module for available real estate on a carrier substrate may be increased, a relatively low profile of a die or die stack may be maintained. Further, the undesirably high inductance and capacitance of wire bonds is reduced to a more desirable level, with inductance being on the order of 0.5 nH.

The present invention has been described in specific, exemplary embodiments intended in all respects to be illustrative rather than limiting in nature. It is to be understood that the invention defined by the appended claims is not to be limited by specific details set forth in the above description and that additional embodiments will become apparent to those of ordinary skill in the art to which the invention pertains without departing from the spirit and scope thereof.

What is claimed is:

1. A semiconductor die, comprising:
   bond pads on an active surface of the semiconductor die;
   blind holes extending from a back surface of the semiconductor die opposing the active surface to respective undersides of at least some bond pads; and
   conductive material in the blind holes and electrically coupled with the at least some bond pads, wherein an end of the conductive material opposing the bond pads is exposed beyond the back surface of the semiconductor die, the exposed end of the conductive material being laterally enlarged with respect to a remaining portion of the conductive material.

2. The semiconductor die of claim 1, further comprising a passivation material on at least a portion of a sidewall surface of each blind hole and interposed between the conductive material and the at least a portion of the sidewall surface.

3. The semiconductor die of claim 2, further comprising the passivation material over at least a portion of the back surface of the semiconductor die.

4. The semiconductor die of claim 3, further comprising additional passivation material on at least a portion of the passivation material over the at least a portion of the back surface of the semiconductor die.

5. The semiconductor die of claim 2, further comprising a barrier material interposed between the passivation material and the conductive material.

6. The semiconductor die of claim 1, further comprising a conductive seed material interposed between the bond pads and the conductive material and between a sidewall surface of the blind holes and the conductive material.

7. The semiconductor die of claim 6, further comprising additional conductive seed material interposed between the seed material and the conductive material.

8. The semiconductor die of claim 1, further comprising at least one of a conductive ball, a conductive bump, and a conductive column joined to the exposed end of the conductive material.

9. The semiconductor die of claim 1, wherein a diameter of the blind holes is about one-half or less of a smallest lateral dimension of the bond pads.

10. The semiconductor die of claim 1, wherein the conductive material comprises an annular shape and further comprising a dielectric material laterally surrounded by the conductive material.

11. The semiconductor die of claim 1, wherein the conductive material comprises a plurality of conductive materials.

12. A semiconductor wafer, comprising:
    a plurality of unsingulated semiconductor dice, each unsingulated semiconductor die of the plurality comprising:
    bond pads on an active surface;
    blind holes extending from a back surface opposing the active surface, each blind hole terminating at an underside of a corresponding bond pad; and
    a conductive material disposed in each blind hole in electrical communication with the corresponding bond pad, the conductive material exhibiting an annular shape; and
    a dielectric material laterally surrounded by the conductive material.

13. The semiconductor die of claim 12, further comprising a passivation material interposed between the conductive material and a sidewall surface of each blind hole.

14. The semiconductor die of claim 13, further comprising a barrier material interposed between the passivation material and the conductive material.

15. The semiconductor die of claim 12, further comprising a conductive seed material interposed between each bond pad and its corresponding conductive material and between a sidewall surface of each blind hole and its corresponding conductive material.

16. The semiconductor die of claim 12, wherein diameters of the blind holes are about one-half or less of smallest lateral dimensions of their corresponding bond pads.

* * * * *